(12) United States Patent
Kim et al.

(10) Patent No.: US 11,817,401 B2
(45) Date of Patent: Nov. 14, 2023

(54) SEMICONDUCTOR PACKAGE INCLUDING MOLDING LAYER

(71) Applicant: Samsung Electronics Co., Ltd., Suwon-si (KR)

(72) Inventors: Dongho Kim, Asan-si (KR); Jihwang Kim, Cheonan-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 94 days.

(21) Appl. No.: 17/510,749

(22) Filed: Oct. 26, 2021

(65) Prior Publication Data

US 2022/0344279 A1    Oct. 27, 2022

(30) Foreign Application Priority Data

Apr. 26, 2021 (KR) .................. 10-2021-0053598

(51) Int. Cl.
*H01L 23/00* (2006.01)
*H01L 23/498* (2006.01)
*H01L 23/31* (2006.01)

(52) U.S. Cl.
CPC ........ *H01L 23/562* (2013.01); *H01L 23/3128* (2013.01); *H01L 23/49811* (2013.01); *H01L 23/49822* (2013.01); *H01L 23/49838* (2013.01); *H01L 24/32* (2013.01); *H01L 24/73* (2013.01); *H01L 2224/32225* (2013.01); *H01L 2224/73204* (2013.01)

(58) Field of Classification Search
CPC . H01L 2224/48091; H01L 2224/83104; H01L 2224/32225; H01L 24/29; H01L 24/16; H01L 24/13; H01L 24/32; H01L 24/73; H01L 23/562; H01L 23/3128; H01L 23/49811; H01L 23/49822; H01L 23/49838
See application file for complete search history.

(56) References Cited

U.S. PATENT DOCUMENTS 7,812,265 B2   10/2010   Shin et al.
8,313,984 B2   11/2012   Topacio et al.
(Continued)

FOREIGN PATENT DOCUMENTS

KR   10-2014-0084516 A   7/2014
KR   10-2021-0007692 A   1/2021

*Primary Examiner* — Jasmine J Clark
(74) *Attorney, Agent, or Firm* — Harness, Dickey & Pierce, P.L.C.

(57) ABSTRACT

A semiconductor package including a semiconductor chip, a lower redistribution layer under the semiconductor chip, the lower redistribution layer including a lower insulating layer at a central region and at a portion of an edge region, and a trench at a remaining portion of the edge region, a plurality of outer connecting terminals under the lower redistribution layer, a molding layer including a first molding section and the second molding section, the first molding section being on the lower redistribution layer and surrounding a side surface of the semiconductor chip and the second molding section being in the trench and contacting a side surface of the lower insulating layer, and an upper redistribution layer on the molding layer may be provided. The side surface of the lower insulating layer and a side surface of the second molding section may be coplanar with each other.

20 Claims, 21 Drawing Sheets

(56) References Cited

U.S. PATENT DOCUMENTS

| | | | |
|---|---|---|---|
| 9,349,713 | B2 | 5/2016 | Kim et al. |
| 10,790,254 | B2 | 9/2020 | Huang et al. |
| 10,825,693 | B2 | 11/2020 | Lin et al. |
| 10,886,188 | B2 | 1/2021 | Matsuzawa |
| 2010/0072634 | A1 | 3/2010 | Ha et al. |
| 2019/0237382 | A1* | 8/2019 | Kim ................. H01L 24/92 |
| 2021/0013139 | A1* | 1/2021 | Kim ............. H01L 23/49816 |

* cited by examiner

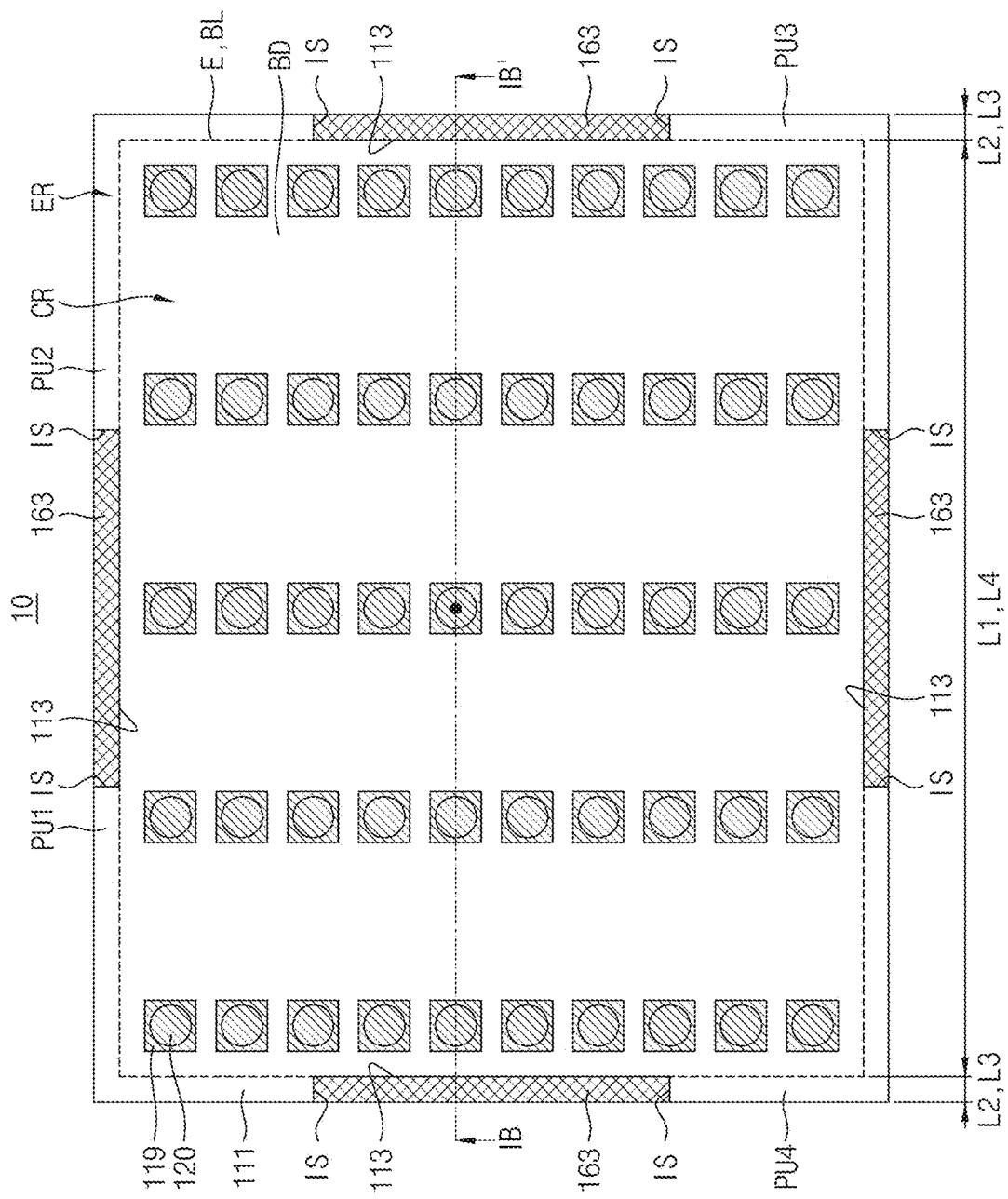

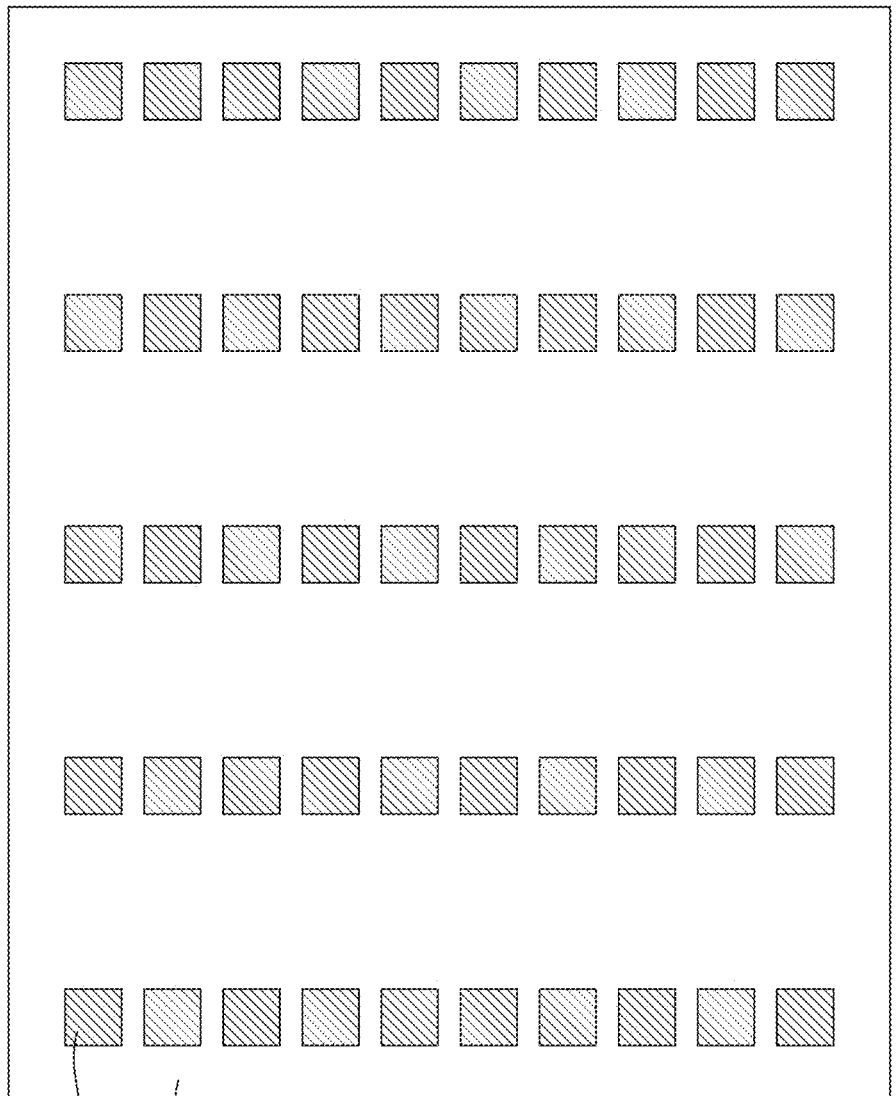

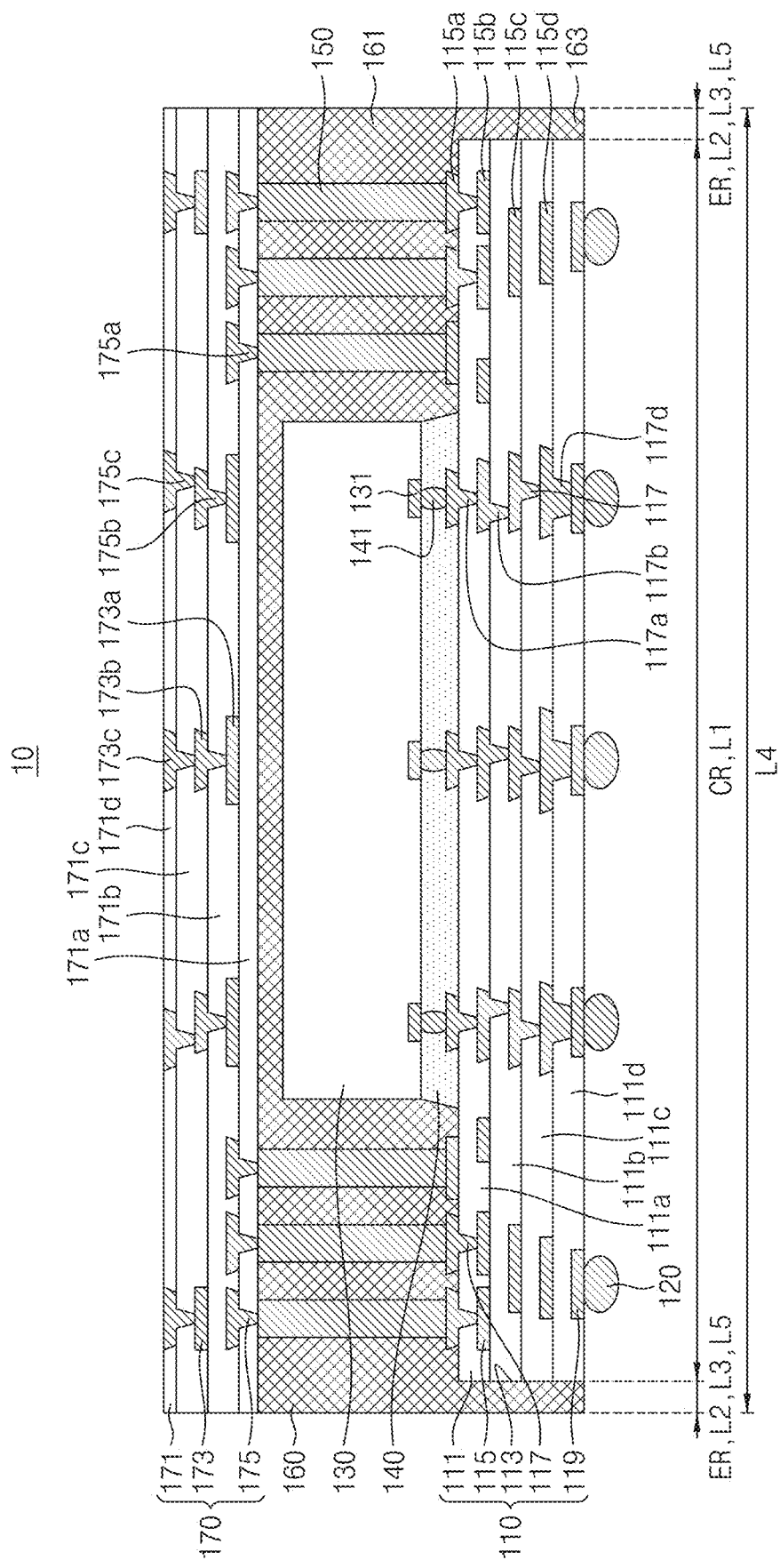

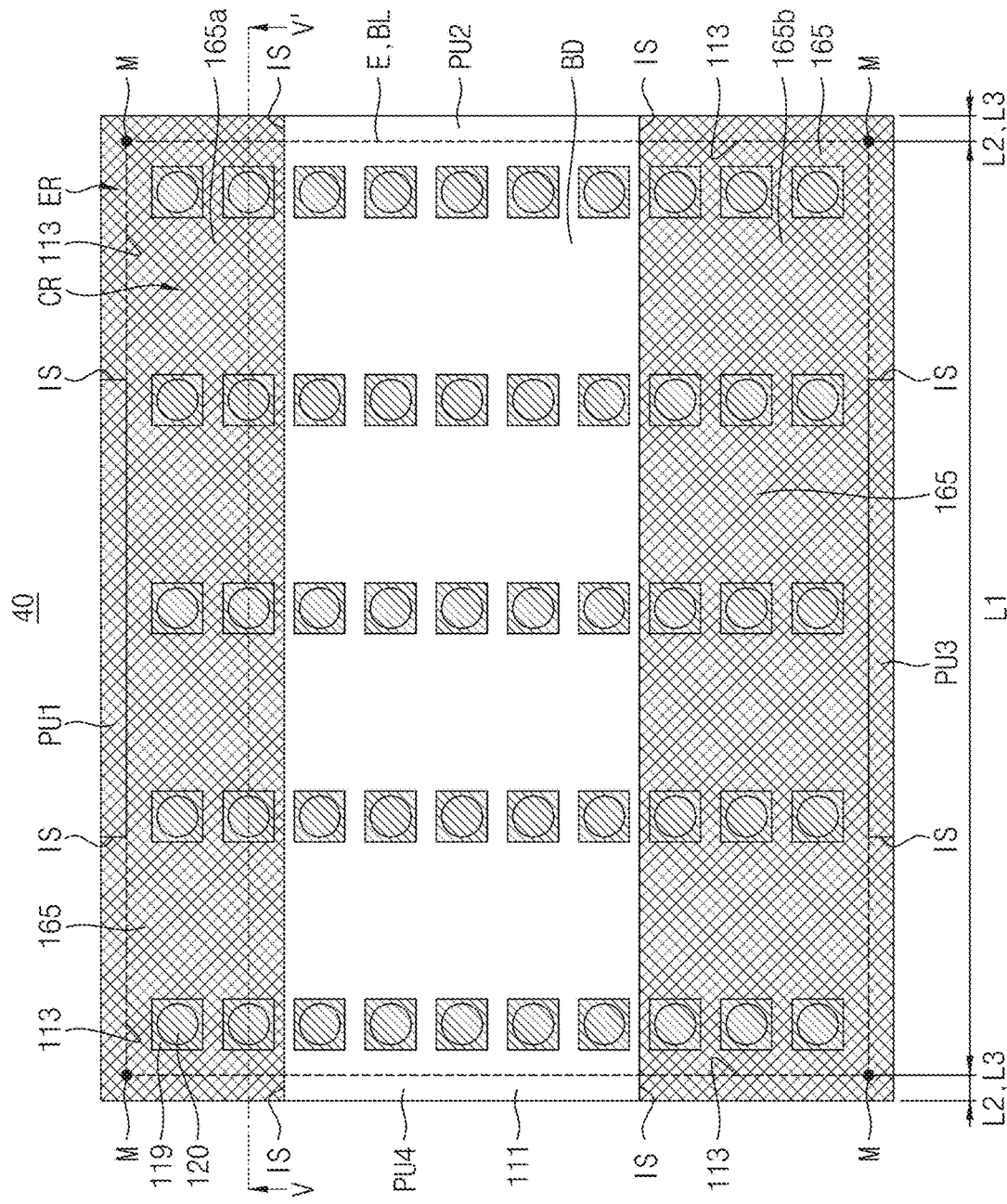

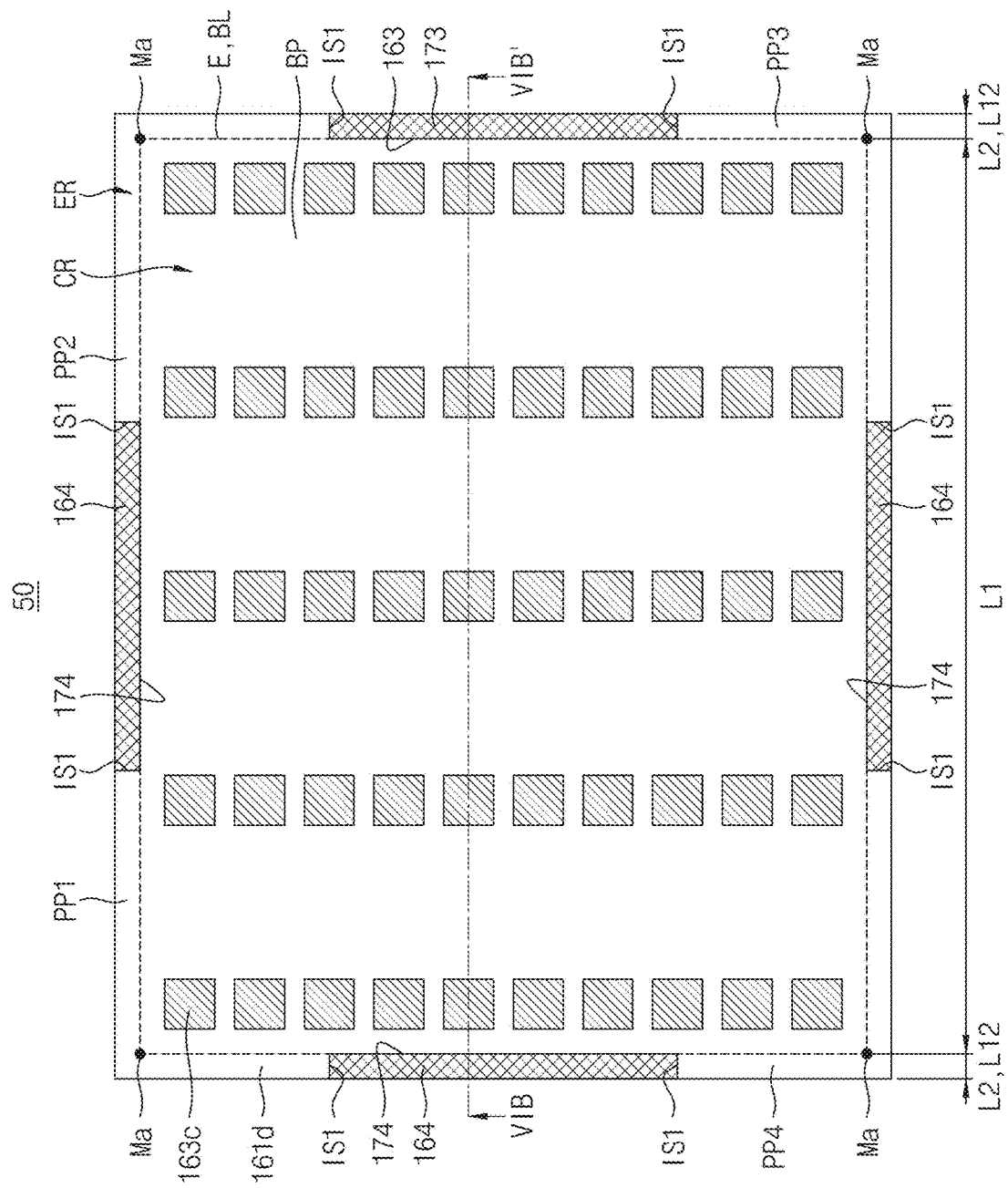

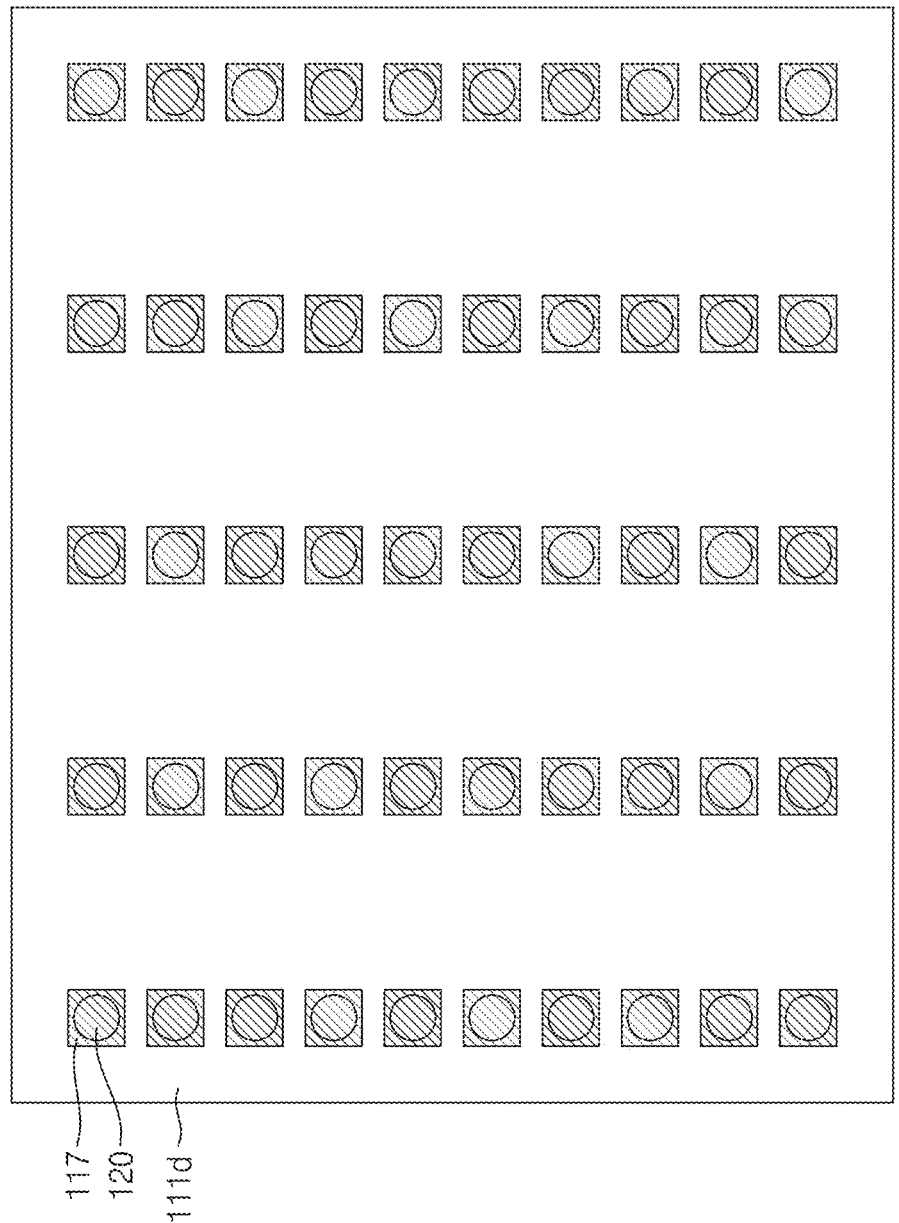

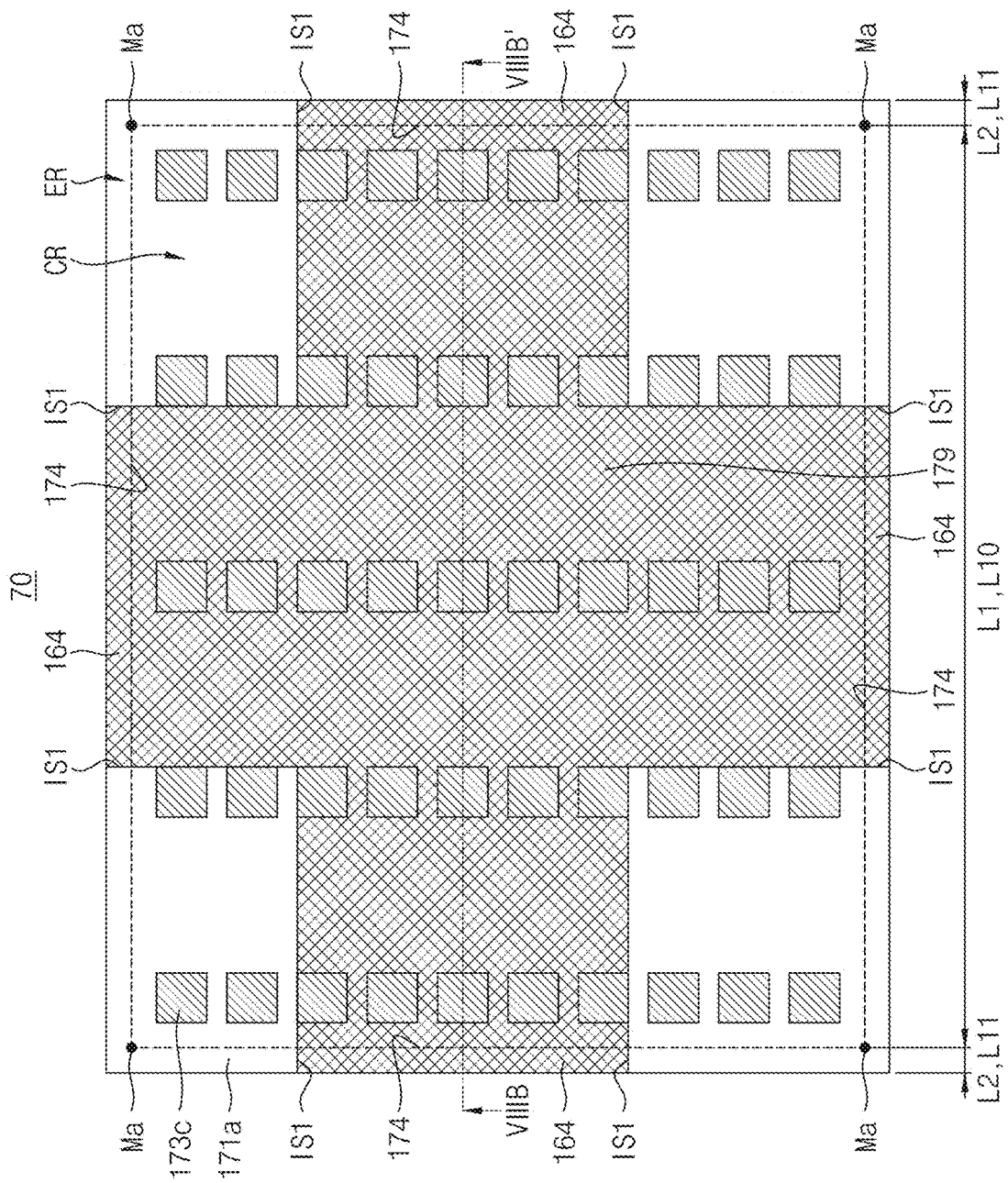

SEMICONDUCTOR PACKAGE INCLUDING MOLDING LAYER

CROSS-REFERENCE TO THE RELATED APPLICATION

This application claims priority under 35 U.S.C. § 119 to Korean Patent Application No. 10-2021-0053598, filed on Apr. 26, 2021, in the Korean Intellectual Property Office, the disclosure of which is incorporated herein by reference in its entirety.

BACKGROUND

1. Field

Example embodiments of the disclosure relate to semiconductor packages including a molding layer.

2. Description of the Related Art

In accordance with demand for high integration and miniaturization of a semiconductor device, a semiconductor device is being scaled down in size. In addition, a semiconductor package is required to process large volumes of data. To this end, a semiconductor package structure, in which a plurality of semiconductor chips is mounted, is applied. Meanwhile, in accordance with high integration and high performance of a semiconductor device, excessive heat may be emitted from such a semiconductor device. For this reason, a warpage phenomenon may occur in a semiconductor package.

SUMMARY

Some example embodiments of the disclosure provide semiconductor packages mitigating or preventing a warpage phenomenon.

A semiconductor package according to an example embodiment of the disclosure includes a semiconductor chip, a lower redistribution layer under the semiconductor chip, the lower redistribution layer including a lower insulating layer and a trench, the lower insulating layer at a central region of the semiconductor package and at a portion of an edge region of the semiconductor package, the trench at a remaining portion of the edge region, a plurality of outer connecting terminals under the lower redistribution layer, a molding layer including a first molding section and a second molding section, the first molding section being on the lower redistribution layer and surrounding a side surface of the semiconductor chip and the second molding section being in the trench and contacting a side surface of the lower insulating layer, and an upper redistribution layer on the molding layer. The side surface of the lower insulating layer and a side surface of the second molding section are coplanar with each other.

A semiconductor package according to an example embodiment of the disclosure includes a semiconductor chip, a lower redistribution layer under the semiconductor chip, an upper redistribution layer on the semiconductor chip, the upper redistribution layer including an upper insulating layer and a trench, the upper insulating layer at a central region and at a portion of an edge region, the trench at a remaining portion of the edge region, and a molding layer including a first molding section and a second molding section, the first molding section being on the lower redistribution layer while and a side surface of the semiconductor chip and the second molding section being in the first trench and contacting a side surface of the upper insulating layer. The side surface of the upper insulating layer and a side surface of the second molding section are coplanar with each other. A height of the second molding section is equal to a height of the upper redistribution layer.

A semiconductor package according to an example embodiment of the disclosure includes a semiconductor chip, a lower redistribution layer under the semiconductor chip, the lower redistribution layer including a lower insulating layer and a trench, the lower insulating layer at a central region and at a portion of an edge region, the trench at a remaining portion of the edge region, lower redistribution patterns in the lower insulating layer, an under bump metallization (UBM) pad at a lower portion of the lower insulating layer, and a lower conductive via interconnecting the lower redistribution patterns and interconnecting the lower redistribution patterns and the UBM pad, an underfill between the semiconductor chip and the lower redistribution layer, an outer connecting terminal under the lower redistribution layer and connected to the UBM pad, a molding layer including a first molding section and a second molding section, the first molding section being on the lower redistribution layer and surrounding a side surface of the semiconductor chip and a second molding section being in the trench and contacting a side surface of the lower insulating layer, an upper redistribution layer disposed on the molding layer, the upper redistribution layer including an upper insulating layer, upper redistribution patterns at the upper insulating layer, and an upper conductive via interconnecting the upper redistribution patterns, and a connecting via on the lower redistribution layer interconnecting the lower redistribution patterns and the upper conductive via. The side surface of the lower insulating layer and a side surface of the second molding section are coplanar with each other. The portion of the edge region is a corner portion of the edge region or a central portion of the edge region.

BRIEF DESCRIPTION OF THE DRAWINGS

FIG. 1A is a bottom view of a semiconductor package according to an example embodiment of the disclosure.

FIG. 1C is a top view of a semiconductor package according to an example embodiment of the disclosure.

FIGS. 2A to 2E are cross-sectional views of a semiconductor package manufacturing method according to an example embodiment of the disclosure.

FIG. 5 is a bottom view of a semiconductor package according to an example embodiment of the disclosure.

FIG. 6A is a top view of a semiconductor package according to an example embodiment of the disclosure.

FIG. 6C is a bottom view of a semiconductor package according to an example embodiment of the disclosure.

FIG. 8A is a top view of a semiconductor package according to an example embodiment of the disclosure.

DETAILED DESCRIPTION

Figure 1B:
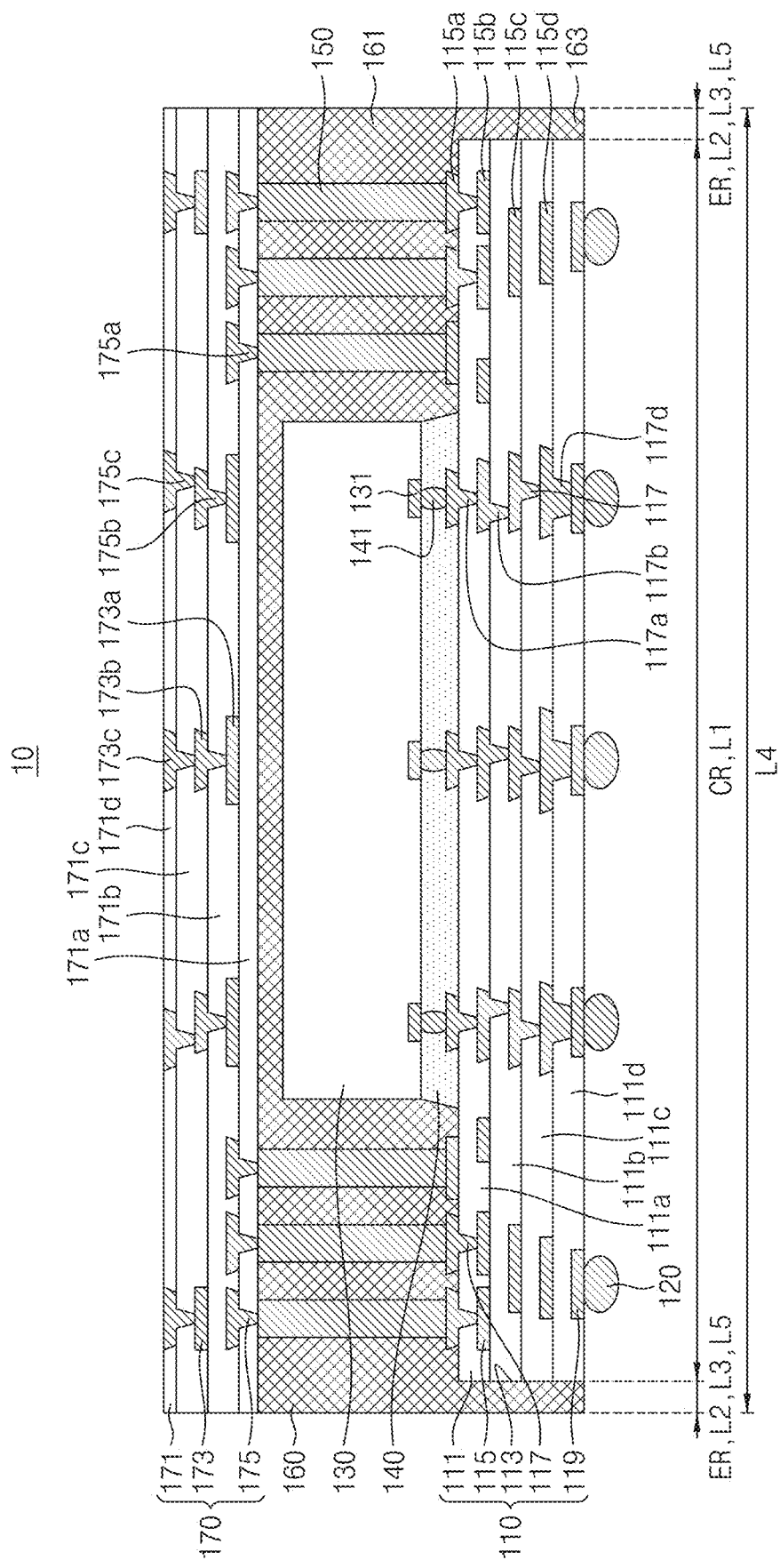
FIG. 1B is a cross-sectional view taken along line IB-IB' in FIG. 1A.

FIG. 1A is a bottom view of a semiconductor package according to an example embodiment of the disclosure. FIG. 1B is a cross-sectional view taken along line IB-IB' in FIG. 1A. FIG. 1C is a top view of a semiconductor package according to an example embodiment of the disclosure.

Referring to FIGS. 1A to 1C, a semiconductor package 10 may include a lower redistribution layer 110, an outer connecting terminal 120, a semiconductor chip 130, an underfill 140, a connecting via 150, a molding layer 160, and an upper redistribution layer 170.

The lower redistribution layer 110 may be disposed at a lower portion of the semiconductor package 10. The lower redistribution layer 110 may include a plurality of lower insulating layers 111, a plurality of trenches 113, a plurality of lower redistribution patterns 115, a plurality of lower conductive vias 117, and an under bump metallization (UBM) pad 119.

The semiconductor package 10 may include a central region CR and an edge region ER. When viewed in a plan view, the central region CR may include a central portion of the semiconductor package 10, and may have a quadrangular shape. The edge region ER may surround the central region CR. The edge region ER may extend along an outer side surface of the semiconductor package 10, and may have a quadrangular rim shape when viewed in a plan view. For example, a width L1 of the central region CR may be 10 to 15 mm, and a width L2 of the edge region ER may be 200 to 400 μm.

The plurality of lower insulating layers 111 may be disposed at the entirety of the central region CR and a part of the edge region ER. The plurality of lower insulating layers 111 may include a body BD disposed in the central region CR, and a plurality of protrusions PU1, PU2, PU3 and PU4 disposed in the edge region ER. The plurality of lower insulating layers 111 may include first to fourth protrusions PU1, PU2, PU3 and PU4. Each of the protrusions PU1, PU2, PU3 and PU4 may have an L shape when viewed in a plan view. The protrusions PU1, PU2, PU3 and PU4 may contact four corners M of the body BD, respectively, and may contact portions of an edge E of the body BD, respectively. The edge E of the body BD may be vertically aligned with a boundary line BL defining the central region CR.

The plurality of trenches 113 may be disposed in the edge region ER. The plurality of trenches 113 may be formed at portions of the edge region ER other than portions of the edge region ER at which the plurality of protrusions PU1, PU2, PU3 and PU4 is disposed. The plurality of trenches 113 may be defined by the plurality of protrusions PU1, PU2, PU3 and PU4 and the body BD. Each trench 113 may be defined by inner side surfaces IS of two protrusions disposed nearest to each other and the edge E of the body BD. The plurality of trenches 113 may be spaced apart from one another.

The lower insulating layers 111 may include a first lower insulating layer 111a, a second lower insulating layer 111b contacting a bottom surface of the first lower insulating layer 111a at a top surface thereof, a third lower insulating layer 111c contacting a bottom surface of the second lower insulating layer 111b at a top surface thereof, and a fourth lower insulating layer 111d contacting a bottom surface of the third lower insulating layer 111c at a top surface thereof. For example, the lower insulating layer 111 may include at least one of an Ajinomoto build-up film (ABF), epoxy, polyimide, or a photosensitive polymer. The photosensitive polymer may include at least one of photosensitive polyimide, polybenzoxazole, a phenol series polymer and a benzocyclobutene series polymer.

The plurality of lower redistribution patterns 115 may include a first low redistribution pattern 115a disposed on the first lower insulating layer 111a, a second redistribution pattern 115b disposed in the first lower insulating layer 111a, a third redistribution pattern 115c disposed in the second lower insulating layer 111b, and a fourth redistribution pattern 115d disposed in the third lower insulating layer 111c. For example, the lower redistribution patterns 115 may include copper, nickel, stainless steel or a copper alloy such as beryllium copper.

The plurality of lower conductive vias 117 may include a first lower conductive via 117a electrically interconnecting the first lower redistribution pattern 115a and the second lower redistribution pattern 115b while extending through the first lower insulating layer 111a, a second lower conductive via 117b electrically interconnecting the second lower redistribution pattern 115b and the third lower redistribution pattern 115c while extending through the second lower insulating layer 111b, a third lower conductive via 117c electrically interconnecting the third lower redistribution pattern 115c and the fourth lower redistribution pattern 115d while extending through the third lower insulating layer 111c, and a fourth lower conductive via 117d electrically interconnecting the fourth lower redistribution pattern 115d and the UBM pad 119 while extending through the fourth lower insulating layer 111d. For example, the lower conductive vias 117 may include copper, nickel, stainless steel or a copper alloy such as beryllium copper.

The UBM pad 119 may be disposed at a lower portion of the fourth lower insulating layer 111d. A bottom surface of the UBM pad 119 may be exposed, and may be coplanar with a bottom surface of the fourth lower insulating layer 111d. For example, the UBM pad 119 may include copper. In an example embodiment, the lower redistribution layer 110 may be a printed circuit board (PCB). In another example embodiment, the lower redistribution layer 110 may be a package substrate including an insulator including ceramic, plastic, glass or a polymer organic substance.

The outer connecting terminal 120 may be disposed under the lower redistribution layer 110. The outer connecting terminal 120 may be connected to the UBM pad 119. For example, the outer connecting terminal 120 may be a solder ball or a solder bump.

The semiconductor chip 130 may be disposed over the lower redistribution layer 110. The semiconductor chip 130 may be disposed at a central portion of the lower redistribution layer 110. Although only one semiconductor chip 130 is shown, this is only illustrative, and the semiconductor chip 120 may be provided in plural. For example, the semiconductor chip 130 may be an application processor (AP) chip such as a microprocessor, a microcontroller, etc., a logic chip such as a central processing unit (CPU), a graphics processing unit (GPU), a modem, an applicationspecific integrated circuit (ASIC), a field programmable gate array (FPGA), etc., a volatile memory such as dynamic random access memory (DRAM), static random access memory (SRAM), etc., a non-volatile memory such as phase-change random access memory (PRAM), magnetoresistive random access memory (MRAM), ferroelectric random access memory (FeRAM), resistive random access memory (RRAM), etc., flash memory or high-bandwidth memory (HBM), or may be configured by a combination thereof.

The semiconductor chip 130 may include a conductive pad 131. The conductive pad 131 may be disposed on a bottom surface of the semiconductor chip 130. For example, the conductive pad 131 may include at least one of an electrolytically-deposited (ED) copper foil, a rolled-annealed (RA) copper foil, a stainless steel foil, an aluminum foil, an ultra-thin copper foil, sputtered copper, or copper alloys.

The underfill 140 may be interposed between the lower redistribution layer 110 and the semiconductor chip 130. The underfill 140 may fill a space between the lower redistribution layer 110 and the semiconductor chip 130. The underfill 140 may be formed of an underfill resin such as epoxy resin, and a silica filler, a flux, or the like may be included therein. An inner connecting terminal 141 may be disposed between the lower redistribution layer 110 and the semiconductor chip 130. The inner connecting terminal 141 may electrically interconnect the first redistribution pattern 115a and the conductive pad 131. For example, the inner connecting terminal 141 may be a solder ball, The connecting via 150 may be disposed on the lower redistribution layer 110. A bottom surface of the connecting via 150 may contact a top surface of the first lower redistribution pattern 115a. The connecting via 150 may electrically interconnect the lower redistribution layer 110 and the upper redistribution layer 170. Although three connecting vias 150 are disposed at each of opposite sides of the lower redistribution layer 110, this is only illustrative, and example embodiments of the disclosure are not limited thereto.

The molding layer 160 may include a first molding section 161 disposed on the lower redistribution layer 110, and a plurality of second molding sections 163 extending downwards from the first molding section 161 in a vertical direction. The first molding section 161 may surround opposite side surfaces of the semiconductor chip 130, the underfill 140, and a plurality of connecting vias 150. A bottom surface of the first molding section 161 may be coplanar with a top surface of the lower redistribution layer 110. For example, a width L4 of the first molding section 161 may be 10 to 16 mm.

The plurality of second molding sections 163 may be disposed in the plurality of trenches 113. An outer side surface of the plurality of second molding sections 163 may be aligned with an outer side surface of the first molding section 161. A bottom surface of the plurality of second molding sections 163 may be coplanar with a bottom surface of the lower redistribution layer 110. The plurality of second molding sections 163 may contact the edge E of the body BD of the plurality of lower insulating layers 111 exposed by the plurality of trenches 113. The plurality of second molding sections 163 may contact corresponding ones of the inner side surfaces IS of the plurality of protrusions PU1, PU2, PU3 and PU4 exposed by the plurality of trenches 113, respectively. The outer side surface of the plurality of second molding sections 163 may be coplanar with an outer side surface of the plurality of protrusions PU1, PU2, PU3 and PU4 of the plurality of lower insulating layers 111 disposed in the edge region ER. A minimum width L5 of each of the plurality of second molding sections 163 may be equal to the width L2 of the edge region ER.

The upper redistribution layer 170 may be disposed on the molding layer 160. The upper redistribution layer 170 may have a quadrangular plate shape when viewed in a plan view. The upper redistribution layer 170 may completely overlap with the central region CR and the edge region ER of the semiconductor package 10 in a vertical direction. The upper redistribution layer 170 may vertically overlap with the body BD of the lower redistribution layer 110, the protrusions PU1, PU2, PU3 and PU4, and the plurality of trenches 113.

The upper redistribution layer 170 may include a plurality of upper insulating layers 171, a plurality of redistribution patterns 173, and a plurality of conductive vias 175. The plurality of insulating layers 171 may include a first upper insulating layer 171a contacting a top surface of the first molding section 161 at a bottom surface thereof, a second upper insulating layer 171b contacting a top surface of the first upper insulating layer 171a at a bottom surface thereof, a third upper insulating layer 171c contacting a top surface of the second upper insulating layer 171b at a bottom surface thereof, and a fourth upper insulating layer 171d contacting a top surface of the third upper insulating layer 171c at a bottom surface thereof. The plurality of upper insulating layers 171 may be configured by the same material as the plurality of lower insulating layers 111.

The plurality of upper redistribution patterns 173 may include a first upper redistribution pattern 173a disposed in the second upper insulating layer 171b, a second upper redistribution pattern 173b disposed in the third upper insulating layer 171c, and a third upper redistribution pattern 173c disposed in the fourth upper insulating layer 171d. The plurality of upper redistribution patterns 173 may be configured by the same material as the plurality of lower redistribution patterns 115.

The plurality of upper conductive vias 175 may include a first upper conductive via 175a interconnecting the connecting via 150 and the first upper redistribution pattern 173a while extending through the first upper insulating layer 171a, a second upper conductive via 175b interconnecting the first upper redistribution pattern 173a and the second upper redistribution pattern 173b while extending through the second upper insulating layer 171b, and a third upper conductive via 175c interconnecting the second upper redistribution pattern 173b and the third upper redistribution pattern 173c while extending through the third upper insulating layer 171c. The plurality of upper conductive vias 175 may be configured by the same material as the plurality of lower conductive vias 117.

FIGS. 2A to 2E are cross-sectional views of a semiconductor package manufacturing method according to an example embodiment of the disclosure.

Figure 2A:
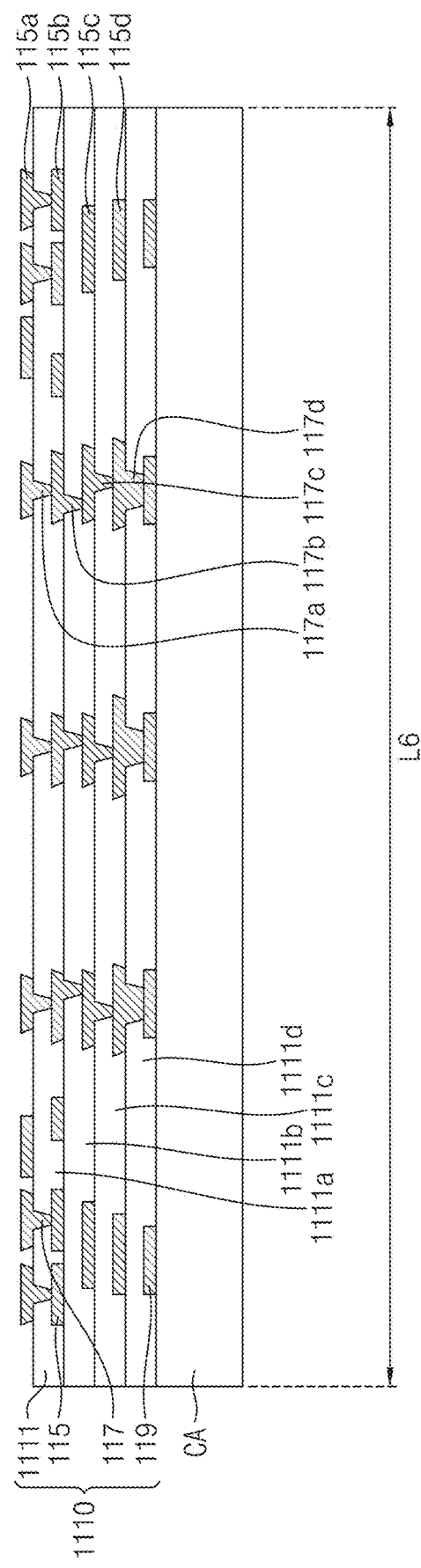

Referring to FIG. 2A, a portion of a fourth lower insulating layer 1111d may be formed on a carrier CA, a trench opened upwards may be formed at the portion of the fourth lower insulating layer 1111d, and a UBM pad 119 may be formed in the trench. The UBM pad 119 may be formed by a plating process. Thereafter, a remaining portion of the fourth lower insulating layer 1111d may be formed, a portion of a third lower insulating layer 1111c may be formed, and a trench opened upwards may be formed at the remaining portion of the fourth lower insulating layer 1111d and the portion of the third lower insulating layer 1111c, and a fourth lower redistribution pattern 115d and a fourth lower conductive via 117d may be formed in the trench. The fourth lower redistribution pattern 115d and the fourth lower conductive via 117*d* may be formed by a plating process. A lower redistribution layer 1110 may be formed through repetition of the above-described procedure. For example, a width L6 of the lower redistribution layer 1110 may be 10 to 16 mm.

Figure 2B:
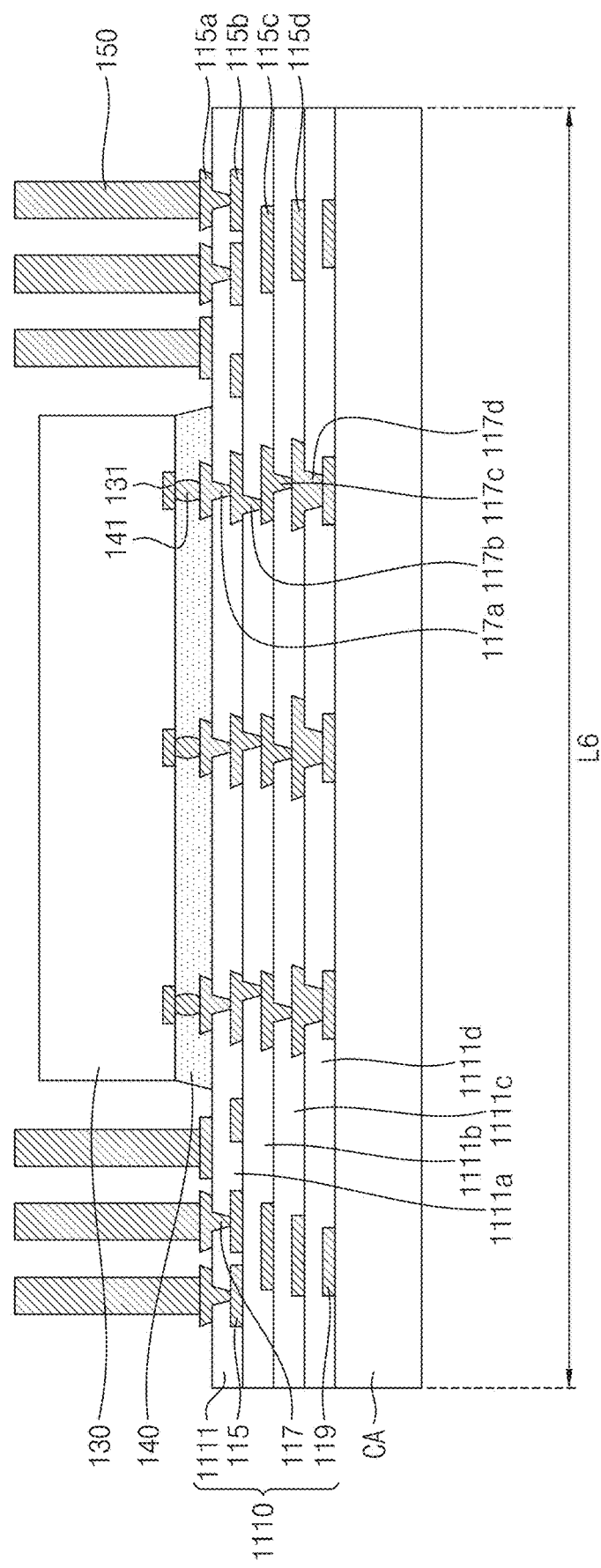

Referring to FIG. 2B, an inner connecting terminal 141 may be disposed on the lower redistribution layer 1110, and a semiconductor chip 130 may be disposed on the inner connecting terminal 141 and, as such, mounting of the semiconductor chip 130 may be achieved. Subsequently, an underfill 140 may be formed under the semiconductor chip 130, and a connecting via 150 may be formed on the lower redistribution layer 1110.

Figure 2C:
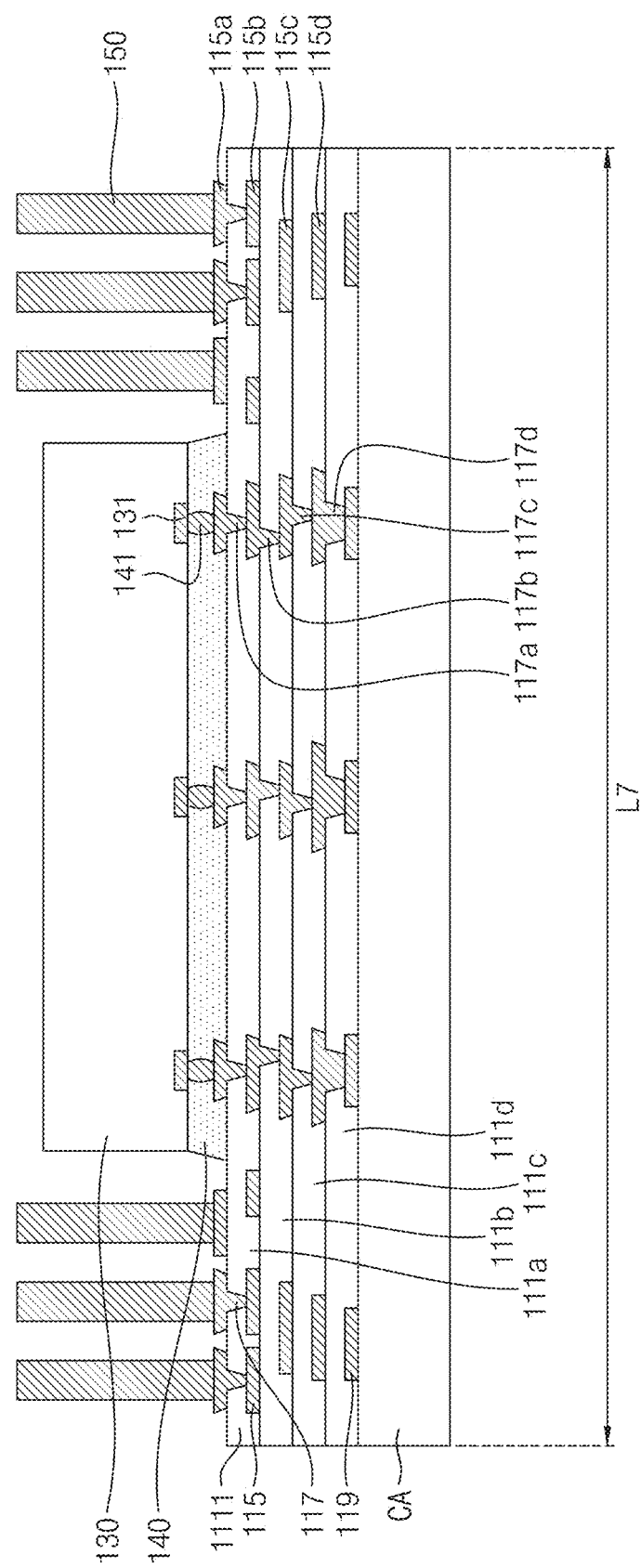

Referring to FIG. 2C, a portion of the lower redistribution layer 1110 may be removed. Through removal of the portion of the lower redistribution layer 1110, a trench may be formed. For example, the minimum width of the removed portion of the lower redistribution layer 1110 may be 100 to 200 µm. That is, the minimum width of the trench may be 100 to 200 µm. A width L7 of the partially-removed lower redistribution layer 1110 may be 10 to 15 mm.

Figure 2D:
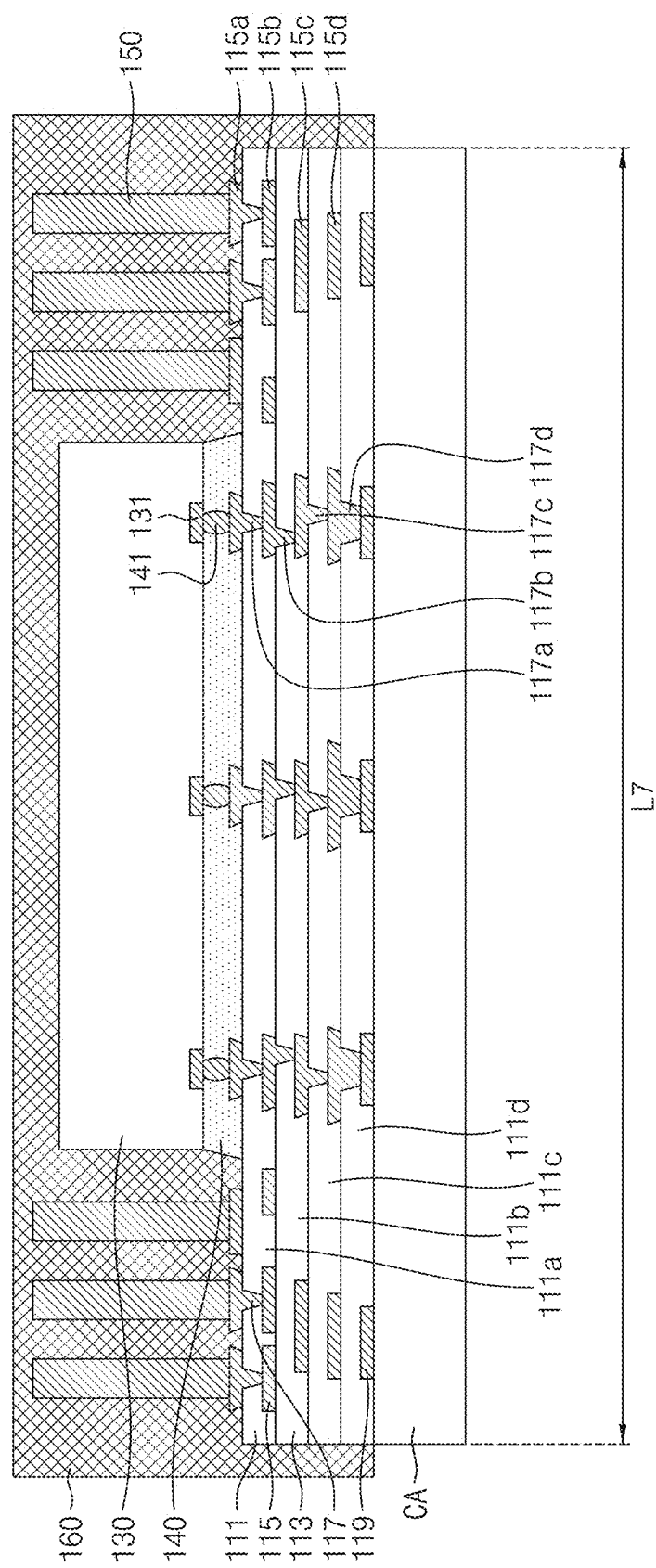

Referring to FIG. 2D, a molding layer 160 may be formed on the lower redistribution layer 1110. The molding layer 160 may be formed by a molding method using a mold.

Referring to FIG. 2E, an upper redistribution layer 170 may be formed on the molding layer 160, the carrier CA may be removed, and an outer connecting terminal 120 may be formed under the lower redistribution layer 1110.

Figure 3:
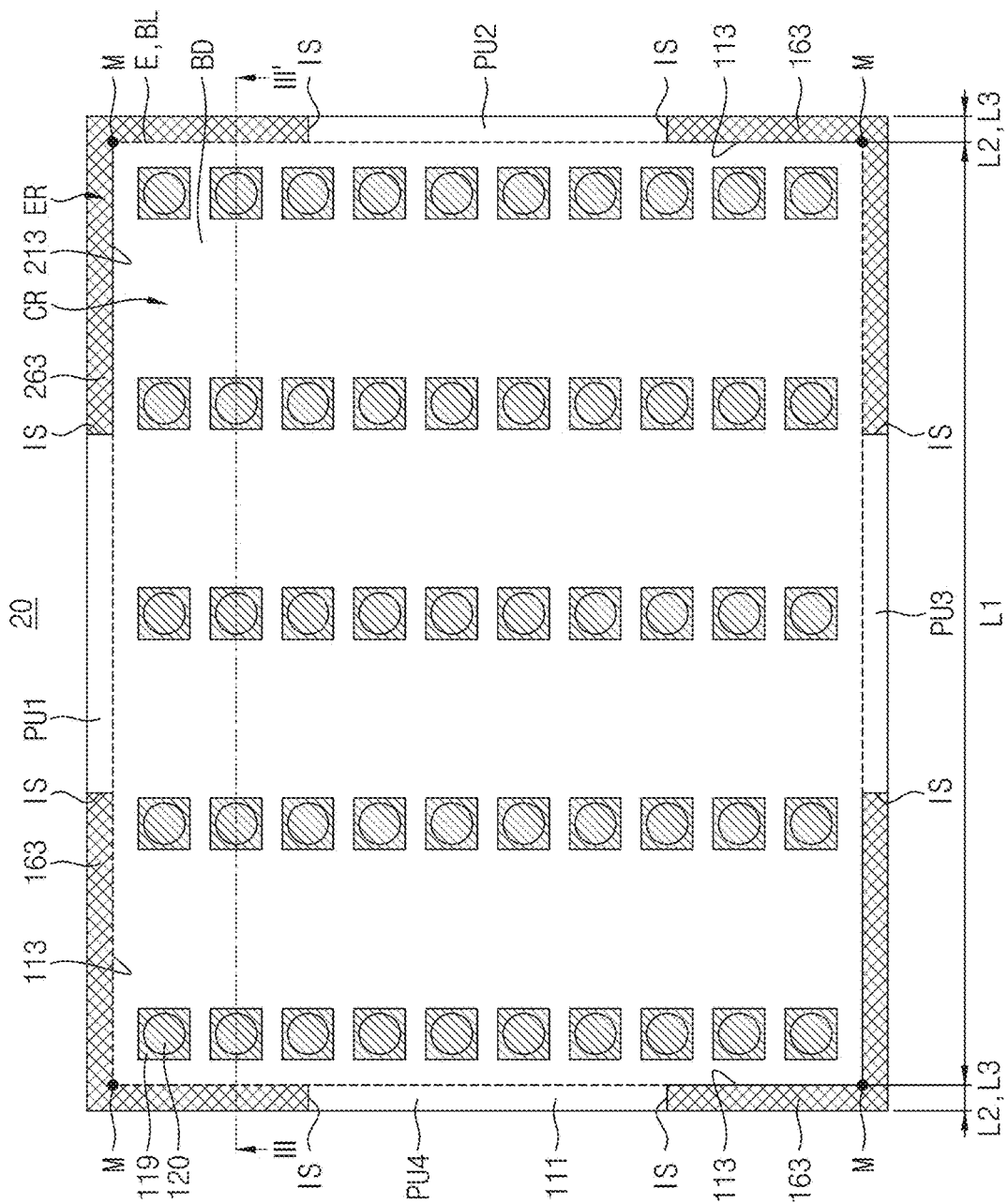
FIG. 3 is a bottom view of a semiconductor package according to an example embodiment of the disclosure.

FIG. 3 is a bottom view of a semiconductor package according to an example embodiment of the disclosure. A cross-sectional view of a semiconductor package 20 taken along line III-III in FIG. 3 may be identical to FIG. 1B.

Referring to FIG. 3, a plurality of lower insulating layers 111 may include a body BD disposed in a central region CR, and a plurality of protrusions PU1, PU2, PU3 and PU4 disposed in an edge region ER. For example, the plurality of lower insulating layers 111 may include first to fourth protrusions PU1, PU2, PU3 and PU4. The plurality of protrusions PU1, PU2, PU3 and PU4 may be disposed at a part of the edge region ER. The protrusions PU1, PU2, PU3 and PU4 may contact portions of an edge E of the body BD, respectively. The protrusions PU1, PU2, PU3 and PU4 may expose four corners M of the body BD and portions of the edge E adjacent to the four corners M, respectively.

A plurality of trenches 113 may be defined by the body BD and the plurality of protrusions PU1, PU2, PU3 and PU4 of the plurality of lower insulating layers 111. The plurality of trenches 113 may expose the corners M of the body BD and portions of the edge E adjacent to the corners M, respectively. The plurality of trenches 113 may expose inner side surfaces IS of the plurality of protrusions PU1, PU2, PU3 and PU4, respectively. Each of the plurality of trenches 113 may have an L shape when viewed in a plan view.

A plurality of second molding sections 163 may be disposed in the plurality of trenches 113. The plurality of second molding sections 163 may contact the edge E of the body BD and the inner side surfaces IS of the plurality of protrusions PU1, PU2, PU3 and PU4 which are exposed by the plurality of trenches 113. Each of the plurality of second molding sections 163 may have an L shape when viewed in a plan view. When viewed in a plan view, the plurality of second molding sections 163 may be spaced apart from one another by the plurality of protrusions PU1, PU2, PU3 and PU4. An outer side surface of the plurality of second molding sections 163 may be coplanar with an outer side surface of the lower insulting layers 111 disposed in the edge region ER.

Figure 4A:
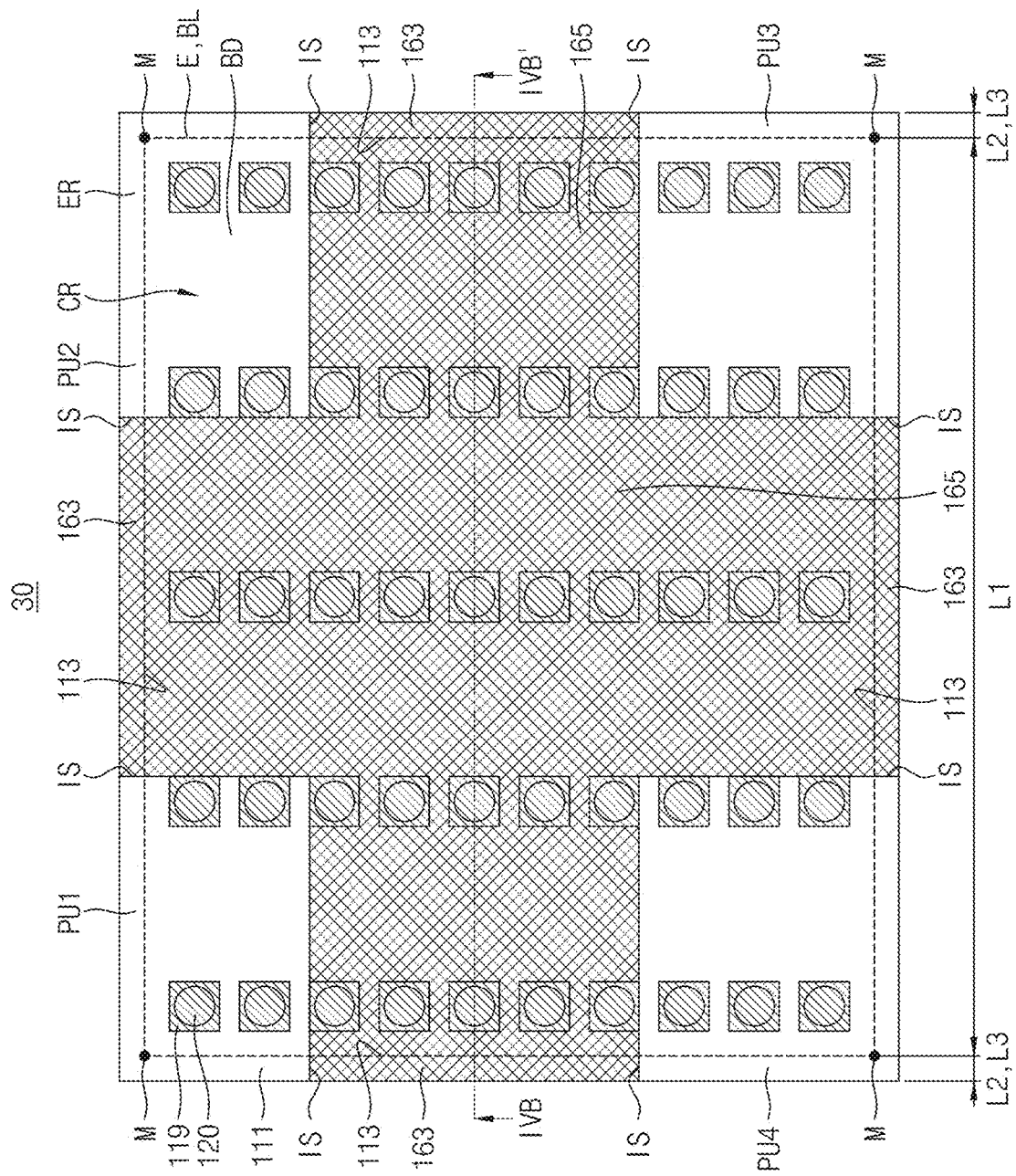
FIG. 4A is a bottom view of a semiconductor package according to an exemplary embodiment of the disclosure.
Figure 4B:
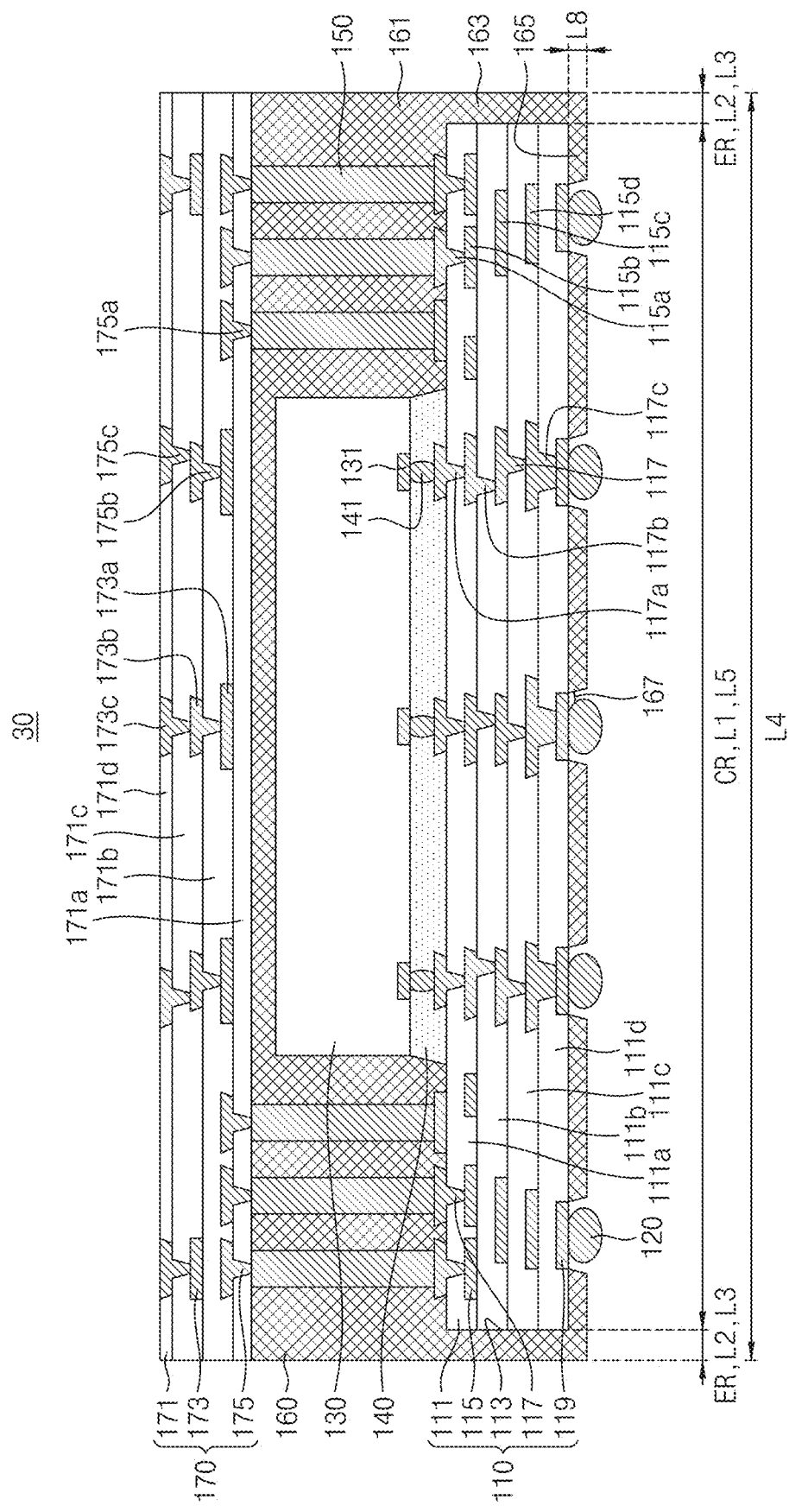
FIG. 4B is a cross-sectional view taken along line IVB-IVB' in FIG. 4A.

FIG. 4A is a bottom view of a semiconductor package according to an example embodiment of the disclosure. FIG. 4B is a cross-sectional view taken along line IVB-IVB' in FIG. 4A.

Referring to FIGS. 4A and 4B, a semiconductor package 30 differs from the semiconductor package 10 of FIG. 1B in that a molding layer 160 further includes a third molding section 165. The third molding section 165 may be disposed under a lower redistribution layer 110 and second molding sections 163. The third molding section 165 may cover a bottom surface of the second molding section 163. The third molding section 165 may be formed integrally with a first molding section 161 and the second molding section 163.

The third molding section 165 may cover a portion of the bottom surface of the lower redistribution layer 110. The third molding section 165 may expose a portion of the bottom surface of the lower redistribution layer 110. In an example embodiment, the third molding section 165 may have a cross shape when viewed in a plan view. The third molding section 165 may expose portions including corners of the lower redistribution layer 110 from among all portions of the bottom surface of the lower redistribution layer 110. A groove 167 exposing a UBM pad 119 may be formed at the third molding section 165. A portion of an outer connecting terminal 120 may be disposed in the groove 167. A height L8 of the third molding section 165 may be smaller than a height of the outer connecting terminal 120. For example, the height L8 of the third molding section 165 may be 40 to 60 µm.

FIG. 5 is a bottom view of a semiconductor package according to an example embodiment of the disclosure. A cross-sectional view of a semiconductor package 40 taken along line V-V' in FIG. 5 may be identical to FIG. 4B.

Referring to FIGS. 4B and 5, a lower insulating layer 111 of the semiconductor package 40 may have the same characteristics as the lower insulating layer 111 of FIG. 3, except that the lower insulating layer 111 of the semiconductor package 40 further includes a third molding section 165. The third molding section 165 may cover a part of a bottom surface of the lower insulating layer 111 while exposing a remaining part of the bottom surface of the lower insulating layer 111. In an example embodiment, the third molding section 165 may include a first portion 165*a* and a second portion 165*b* which are spaced apart from each other. The first portion 165*a* may cover a bottom surface of a first protrusion PU1 of a plurality of lower insulating layers 111. The first portion 165*a* may vertically overlap with two trenches 113 disposed adjacent to the first protrusion PU1 and two second molding sections 163 disposed in the trenches 113. The first portion 165*a* may cover a portion of a body BD disposed adjacent to the first protrusion PU1. The second portion 165*b* may cover a bottom surface of a third protrusion PU3 facing the first protrusion PU1. The second portion 165*b* may vertically overlap with two trenches 113 disposed adjacent to the third protrusion PU3 and two second molding sections 163 disposed in the trenches 113. A second protrusion PU2 and a fourth protrusion PU4 facing each other may be exposed between the first portion 165*a* and the second portion 165*b*. A portion of the body BD between the second protrusion PU2 and the fourth protrusion PU4 may be exposed between the first portion 165*a* and the second portion 165*b*.

Figure 6B:
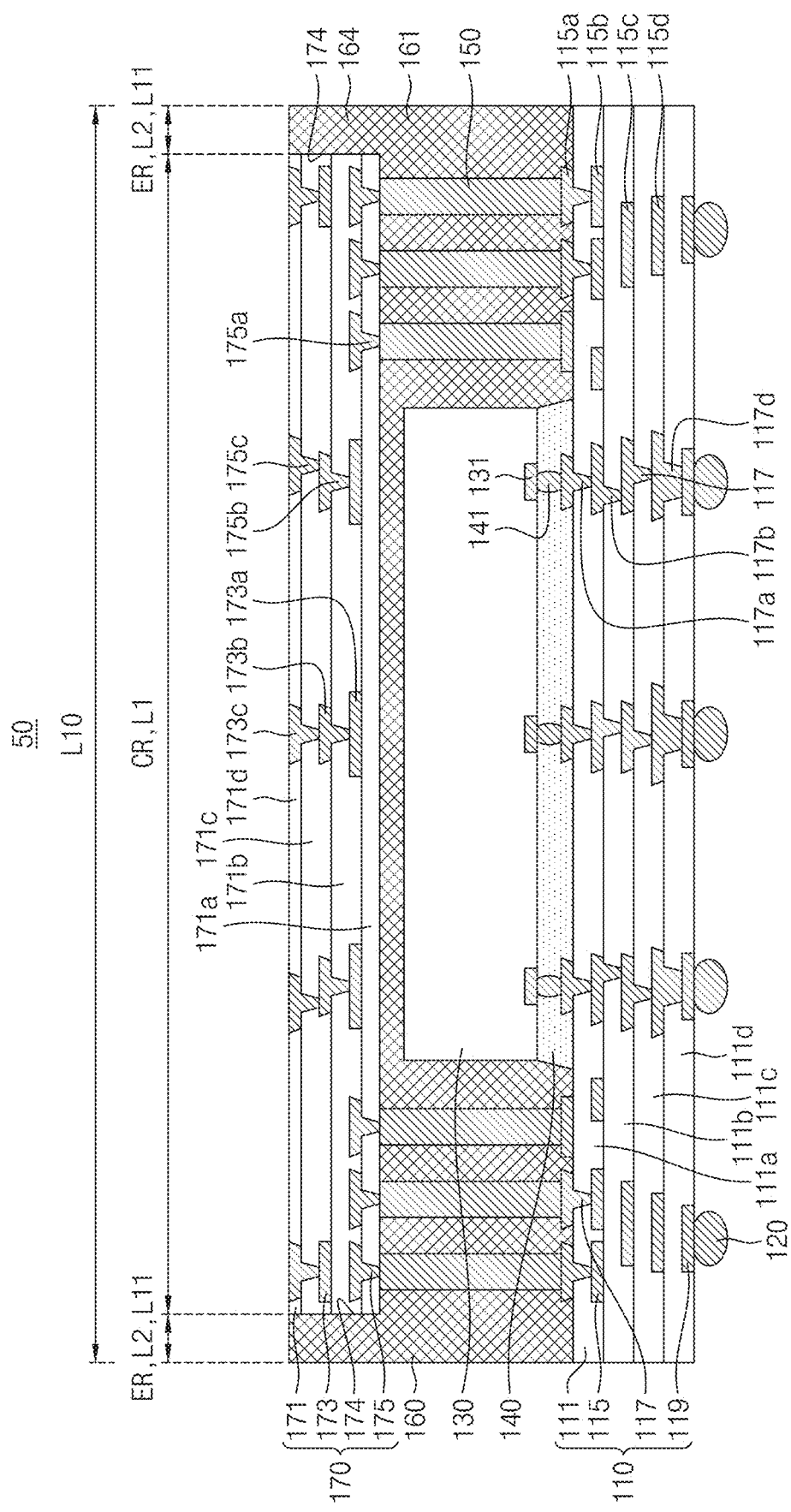
FIG. 6B is a cross-sectional view taken along line VIB-VIB' in FIG. 6A.

FIG. 6A is a top view of a semiconductor package according to an example embodiment of the disclosure. FIG. 6B is a cross-sectional view taken along line VIB-VIB' in FIG. 6. FIG. 6C is a bottom view of a semiconductor package according to an example embodiment of the disclosure.

Referring to FIGS. 6A to 6C, a semiconductor package 50 has the same characteristics as the semiconductor package 10 described with reference to FIGS. 1A and 1B, except that a plurality of lower insulating layers 111 of a lower redistribution layer 110 completely overlap with a central region and an edge region ER in a vertical direction while having a quadrangular plate shape when viewed in a plan view, a plurality of upper insulating layers 171 of upper redistribution layers 170 include a plurality of trenches 174, and a molding layer 160 includes second molding sections 164 disposed in the plurality of trenches 174.

The plurality of upper insulating layers 171 may be disposed at the entirety of the central region CR and a part of the edge region ER. The plurality of upper insulating layers 171 may include a body BP disposed in the central region CR, and a plurality of protrusions PP1, PP2, PP3 and PP4 disposed in the edge region ER. The plurality of upper insulating layers 171 may include first to fourth protrusions PP1, PP2, PP3 and PP4. Each of the protrusions PP1, PP2, PP3 and PP4 may have an L shape when viewed in a plan view. The protrusions PP1, PP2, PP3 and PP4 may contact four corners Ma of the body BP, respectively, and may contact portions of an edge E of the body BP, respectively.

The plurality of trenches 174 may be formed at the plurality of upper insulating layers 171. The plurality of trenches 174 may be disposed in the edge region ER. The plurality of trenches 174 may be formed at portions of the edge region ER other than portions of the edge region ER at which the plurality of protrusions PP1, PP2, PP3 and PP4 are disposed. The plurality of trenches 174 may be defined by the plurality of protrusions PP1, PP2, PP3 and PP4 and the body BP. Each trench 174 may be defined by inner side surfaces IS1 of two protrusions disposed nearest to each other and the edge E1 of the body BP. The plurality of trenches 174 may be spaced apart from one another. A minimum width L10 of each of the plurality of trenches 174 may equal to a minimum width L2 of the edge region ER. The minimum width L10 of each of the plurality of trenches 174 may be about 200 to 400 μm.

The molding layer 160 may include a first molding section 161 and a plurality of second molding sections 164 extending upwards from the first molding section 161 in a vertical direction. The plurality of second molding sections 164 may be disposed in the plurality of trenches 174. A top surface of the plurality of second molding sections 164 may be coplanar with a top surface of the upper redistribution layer 170. The plurality of second molding sections 164 may contact the edge E1 of the body BP of the plurality of upper insulating layers 171 exposed by the plurality of trenches 174. The plurality of second molding sections 164 may contact corresponding ones of the inner side surfaces IS1 of the plurality of protrusions PP1, PP2, PP3 and PP4 exposed by the plurality of trenches 174, respectively. An outer side surface of the plurality of second molding sections 164 may be coplanar with an outer side surface of the plurality of protrusions PP1, PP2, PP3 and PP4. A minimum width L12 of each of the plurality of second molding sections 164 may be equal to the minimum width L2 of the edge region ER.

Figure 7:
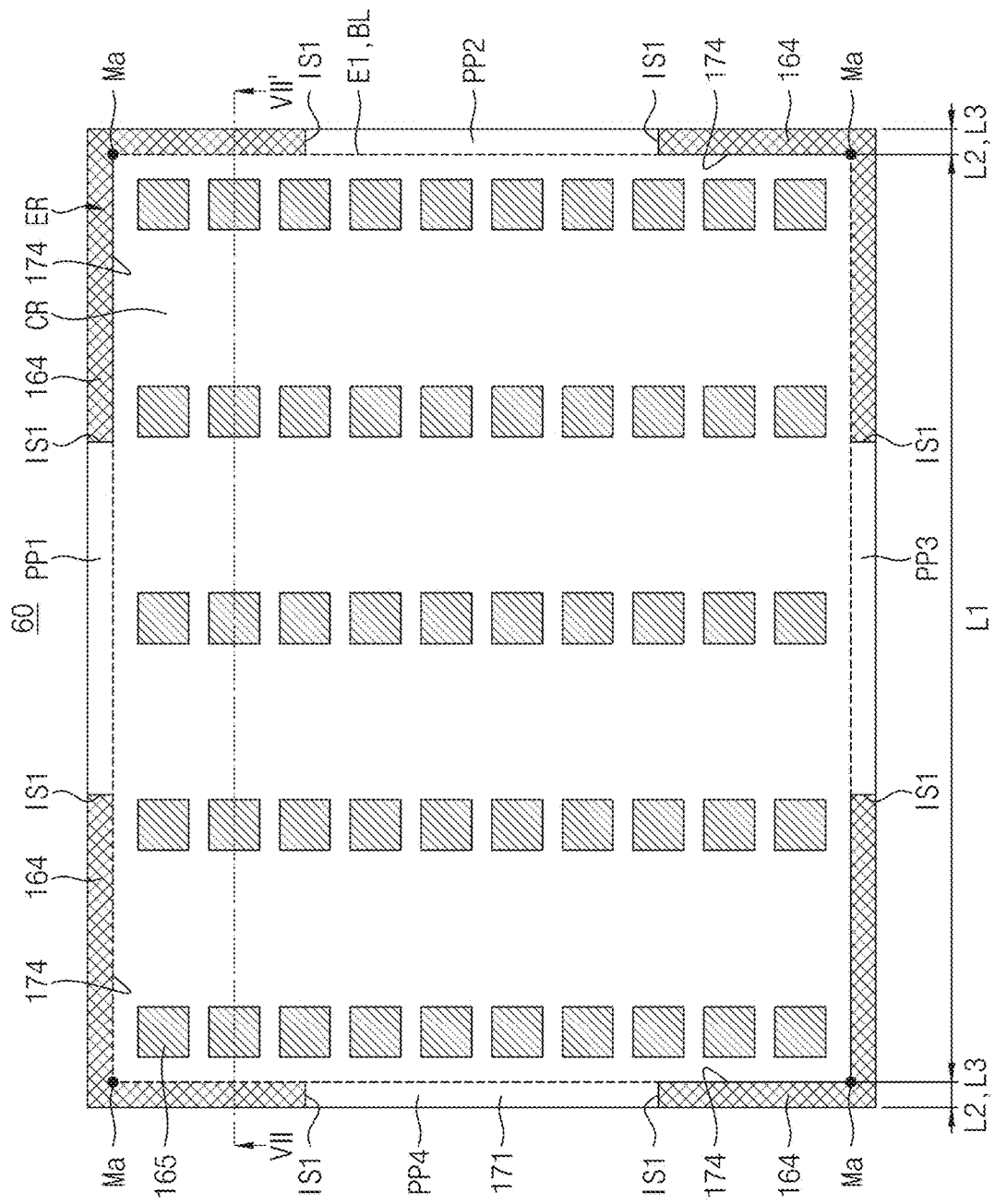
FIG. 7 is a top view of a semiconductor package according to an example embodiment of the disclosure.

FIG. 7 is a top view of a semiconductor package according to an example embodiment of the disclosure. A cross-sectional view of a semiconductor package 60 taken along line VII-VII' in FIG. 7 may be identical to FIG. 6B.

Referring to FIG. 7, a plurality of upper insulating layers 171 may include a body BP disposed in a central region CR, and a plurality of protrusions PP1, PP2, PP3 and PP4 disposed in the edge region ER. For example, the plurality of upper insulating layers 171 may include first to fourth protrusions PP1, PP2, PP3 and PP4. The plurality of protrusions PP1, PP2, PP3 and PP4 may be disposed at a part of the edge region ER. The protrusions PP1, PP2, PP3 and PP4 may contact portions of an edge E of the body BP, respectively. The protrusions PP1, PP2, PP3 and PP4 may expose four corners Ma of the body BP, respectively, and may expose portions of the edge E of the body BP adjacent to the four corners Ma, respectively.

The plurality of trenches 174 may be defined by the body BP of the plurality of upper insulating layers 171 and the plurality of protrusions PP1, PP2, PP3 and PP4. The plurality of trenches 174 may expose the corners Ma of the body BP, respectively, and may expose portions of the edge E1 adjacent to the corners Ma, respectively. The plurality of trenches 174 may expose inner side surfaces IS1 of the plurality of protrusions PP1, PP2, PP3 and PP4, respectively. Each of the plurality of trenches 174 may have an L shape when viewed in a plan view.

A plurality of second molding sections 164 may be disposed in the plurality of trenches 174. The plurality of second molding sections 164 may contact the edge E1 of the body BP and the inner side surfaces IS1 of the plurality of protrusions PP1, PP2, PP3 and PP4, which are exposed by the plurality of trenches 174. Each of the plurality of second molding sections 164 may have an L shape when viewed in a plan view. When viewed in a plan view, the plurality of second molding sections 164 may be spaced apart from one another by the plurality of protrusions PP1, PP2, PP3 and PP4. An outer side surface of the plurality of second molding sections 164 may be coplanar with an outer side surface of the upper insulting layers 171 disposed in the edge region ER.

Figure 8B:
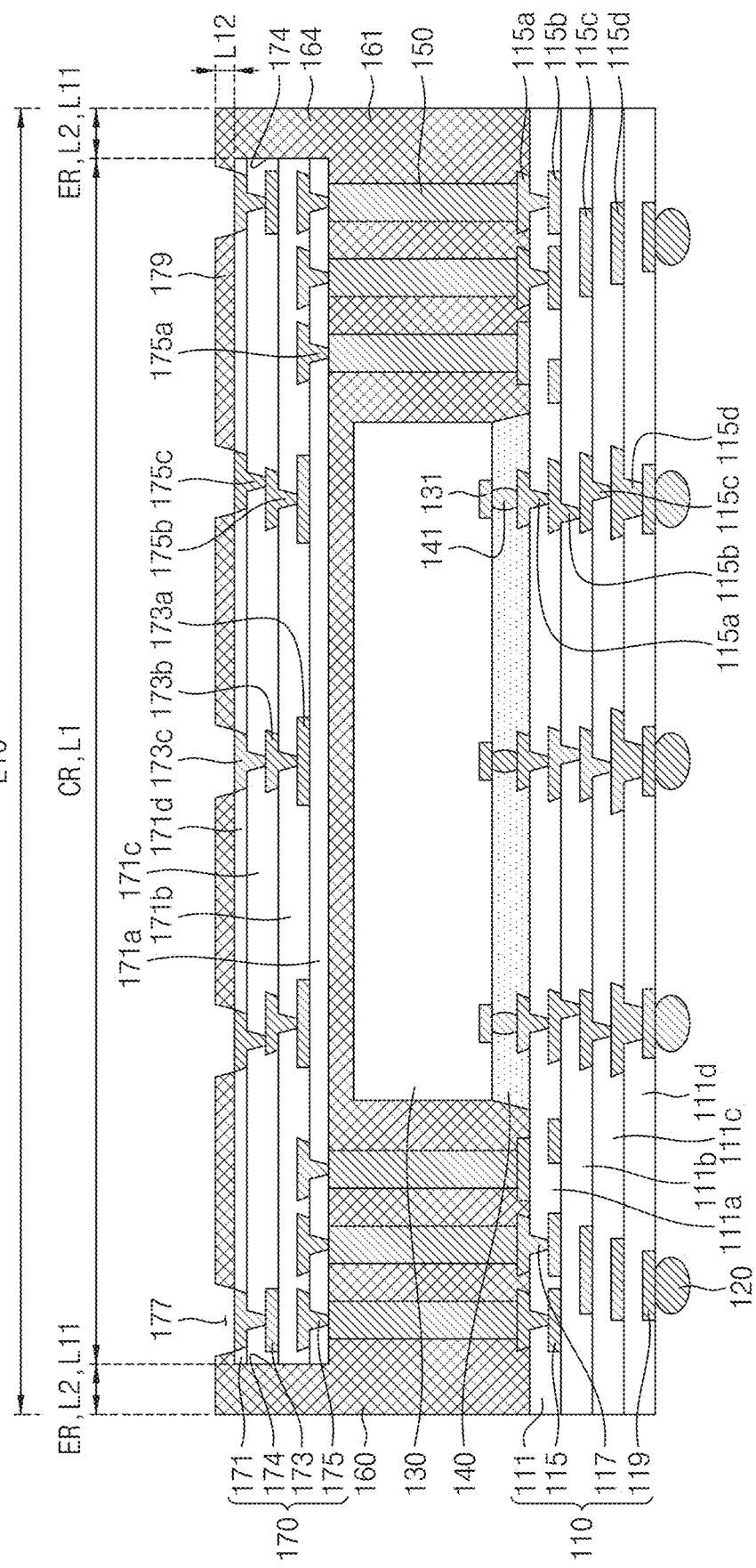
FIG. 8B is a cross-sectional view taken along line VIIIB-VIIIB' in FIG. 8A.

FIG. 8A is a top view of a semiconductor package according to an example embodiment of the disclosure. FIG. 8B is a cross-sectional view taken along line VIIIB-VIIIB' in FIG. 8A.

Referring to FIGS. 8A and 8B, a semiconductor package 70 differs from the semiconductor package 50 of FIGS. 6A to 6C in that a molding layer 160 further includes a third molding section 179. The third molding section 179 may be disposed over an upper redistribution layer 170 and a second molding section 164. The third molding section 179 may cover a top surface of the upper redistribution layer 170. The third molding section 179 may cover a top surface of the second molding section 164. The third molding section 179 may be formed integrally with a first molding section 161 and the second molding section 164.

The third molding section 179 may cover a portion of the top surface of the upper redistribution layer 170. The third molding section 179 may expose a portion of the top surface of the top redistribution layer 170. In an example embodiment, the third molding section 179 may have a cross shape when viewed in a plan view. The third molding section 179 may expose portions including corners Ma of the upper redistribution layer 179 from among all portions of the top surface of the upper redistribution layer 179. A groove 177 exposing an upper redistribution pattern 173 may be formed at the third molding section 179. The groove 177 may have a greater width at an upper portion thereof than at a lower portion thereof. A height L12 of the third molding section 179 may be 40 to 60 μm.

Figure 9:
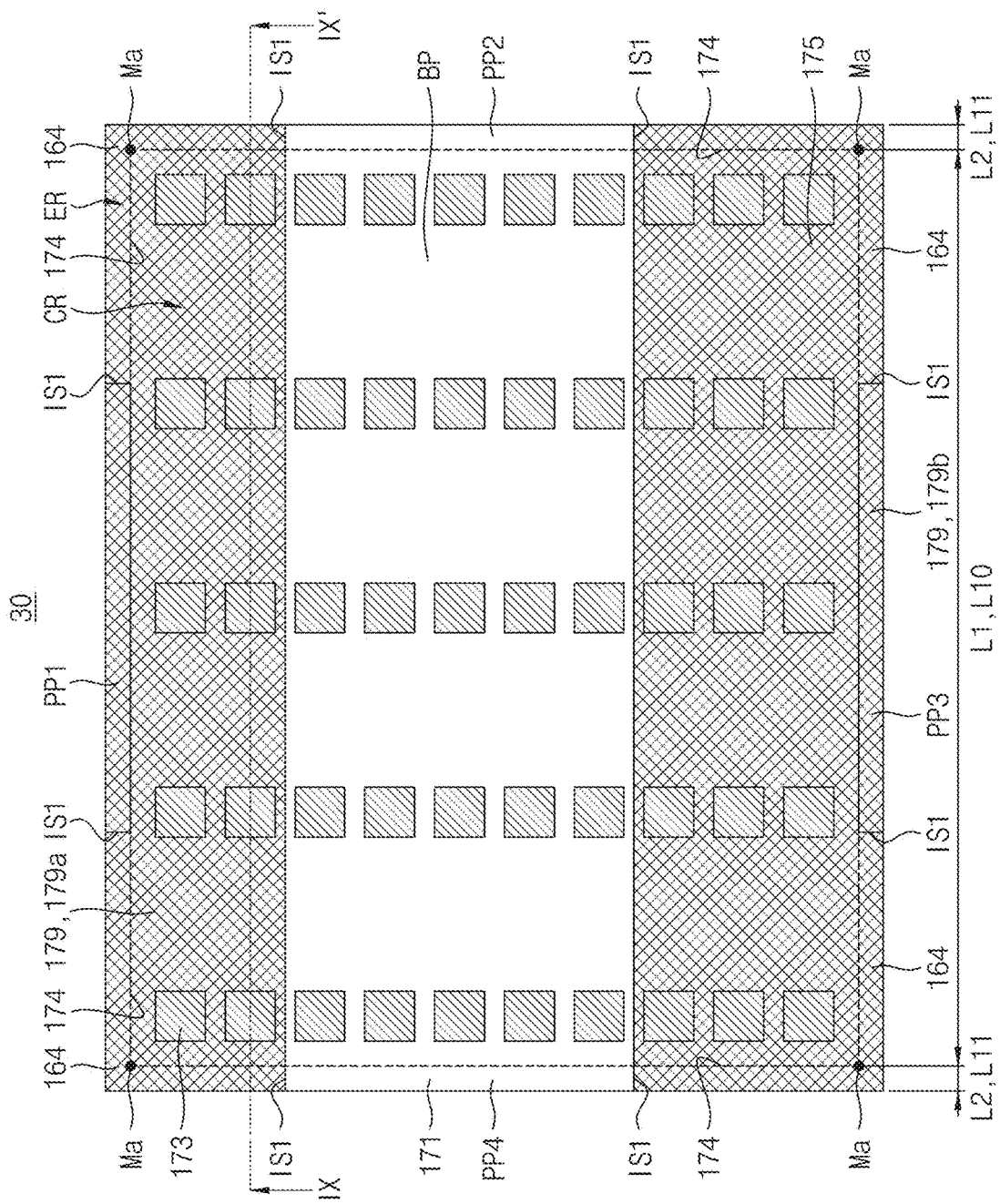
FIG. 9 is a top view of a semiconductor package according to an example embodiment of the disclosure.

FIG. 9 is a top view of a semiconductor package according to an example embodiment of the disclosure. A cross-sectional view of a semiconductor package 80 taken along line IX-IX' in FIG. 9 may be identical to FIG. 8B.

Referring to FIG. 9, an upper insulating layer 171 of the semiconductor package 80 may have the same characteristics as the upper insulating layer 171 of FIG. 7, except that the upper insulating layer 171 of the semiconductor package 80 further includes a third molding section 179. The third molding section 179 may cover a part of a top surface of the upper insulating layer 171 while exposing a remaining part of the top surface of the upper insulating layer 171. In an example embodiment, the third molding section 179 may include a first portion 179a and a second portion 179b which are spaced apart from each other. The first portion 179a may cover a bottom surface of a first protrusion PP1 of a plurality of upper insulating layers 171. The first portion 179a may vertically overlap with two trenches 174 disposed adjacent to the first protrusion PP1 and two second molding sections 164 disposed in the trenches 174. The first portion 179a may cover a portion of a body BP disposed adjacent to the first protrusion PP1. The second portion 179b may cover a bottom surface of a third protrusion PP3 facing the first protrusion PP1. The second portion 179b may vertically overlap with two trenches 113 disposed adjacent to the third protrusion PP3 and two second molding sections 164 disposed in the trenches 174. A second protrusion PP2 and a fourth protrusion PP4 facing each other may be exposed between the first portion 179a and the second portion 179b. A portion of the body BP between the second protrusion PP2 and the fourth protrusion PP4 may be exposed between the first portion 179a and the second portion 179b.

Figure 10:
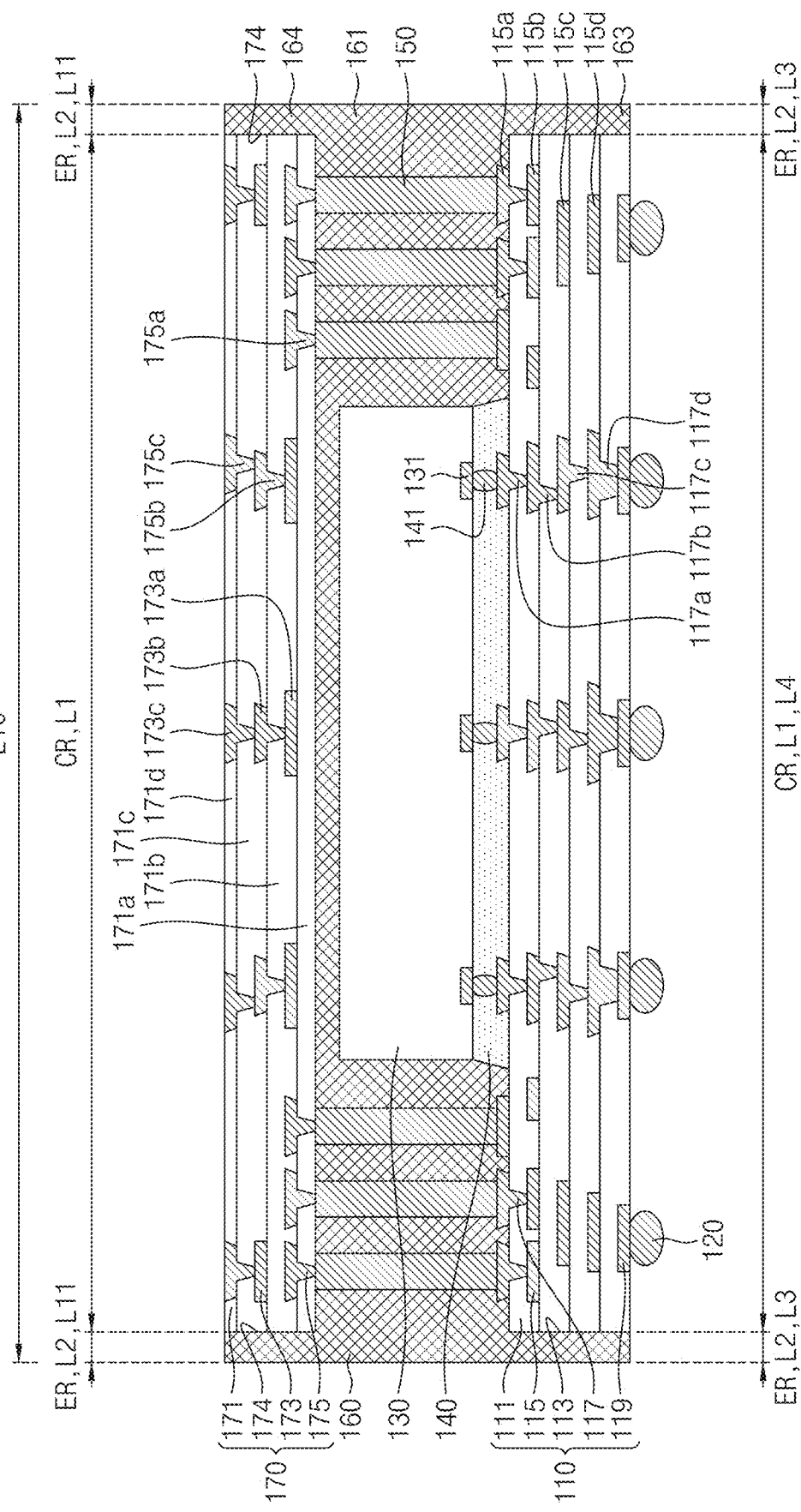
FIG. 10 is a cross-sectional view of a semiconductor package according to an example embodiment of the disclosure.

FIG. 10 is a cross-sectional view of a semiconductor package according to an example embodiment of the disclosure.

Referring to FIG. 10, a lower redistribution layer 110 and an upper redistribution layer 170 of a semiconductor package 90 may include a plurality of trenches 113 and 174. A bottom view of the semiconductor package 90 may be identical to the bottom view of the semiconductor package of FIG. 1A, the bottom view of the semiconductor package 20 of FIG. 3, the bottom view of the semiconductor package 30 of FIG. 4A or the bottom view of the semiconductor package 40 of FIG. 5. A top view of the semiconductor package 90 may be identical to the top view of the semiconductor package 50 of FIG. 6A, the top view of the semiconductor package 60 of FIG. 7, the top view of the semiconductor package 70 of FIG. 8A or the top view of the semiconductor package 80 of FIG. 9.

Figure 11:
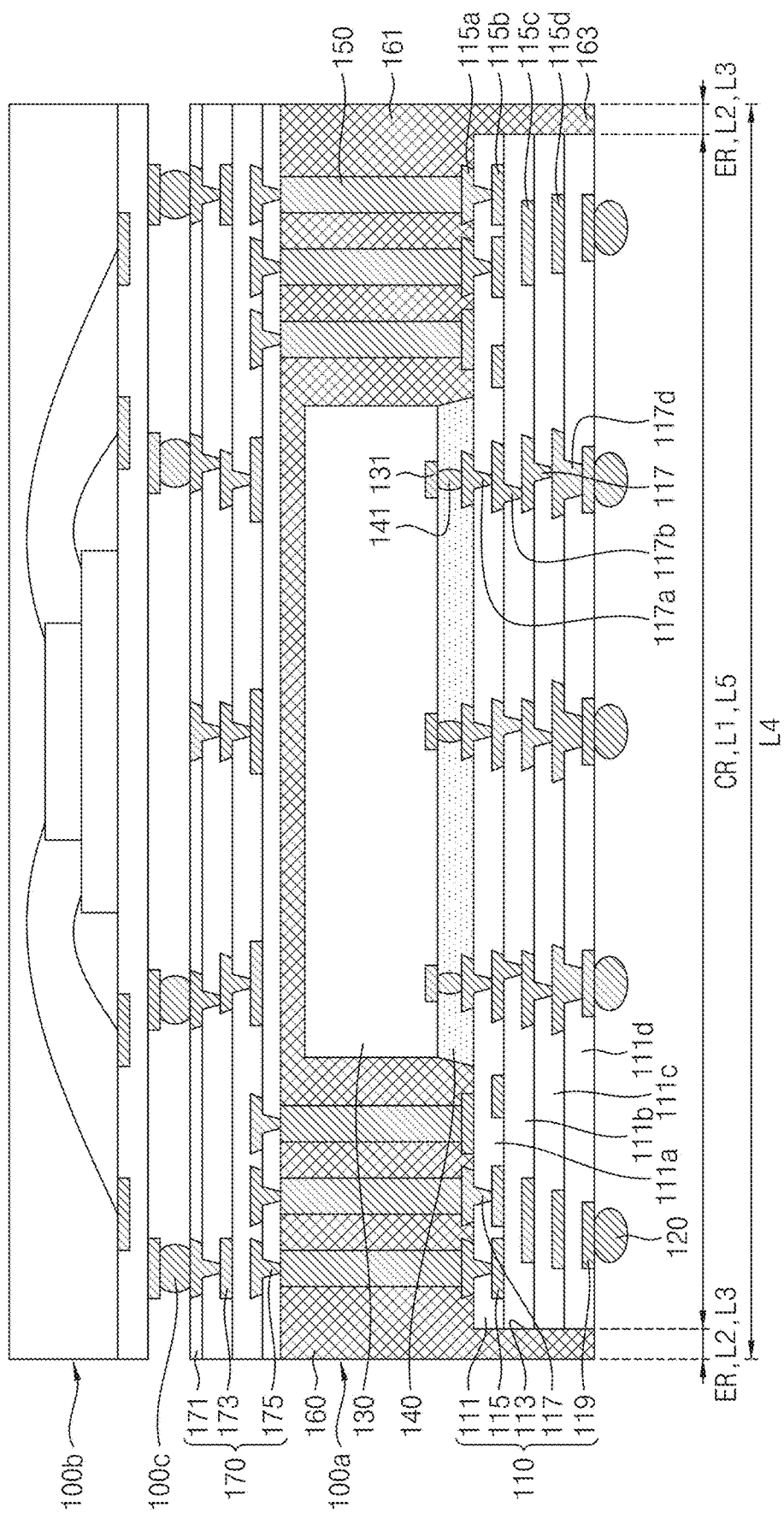
FIG. 11 is a cross-sectional view of a semiconductor package according to an example embodiment of the disclosure.

FIG. 11 is a cross-sectional view of a semiconductor package according to an example embodiment of the disclosure.

Referring to FIG. 11, a semiconductor package 100 may include a lower semiconductor package 100a and an upper semiconductor package 100b. The lower semiconductor package 100a or the upper semiconductor package 100b may be one of the semiconductor package 10 of FIGS. 1A to 1C, the semiconductor package 20 of FIG. 3, the semiconductor package 30 of FIGS. 4A and 4B, the semiconductor package 40 of FIG. 5, the semiconductor package 50 of FIGS. 6A to 6C, the semiconductor package 60 of FIG. 7, the semiconductor package 70 of FIGS. 8A and 8B, the semiconductor package 80 of FIG. 9, or the semiconductor package 90 of FIG. 10. The lower semiconductor package 100a or the upper semiconductor package 100b may be a memory.

The upper semiconductor package 100b may be disposed on the lower semiconductor package 100a. The lower semiconductor package 100a may be connected to the upper semiconductor package 100b by an outer connecting terminal 100c of the upper semiconductor package 100b.

In accordance with the example embodiments of the disclosure, it may be possible to mitigate or prevent a warpage phenomenon of a semiconductor package by forming a trench at a side surface of a redistribution layer, and forming a molding layer at the trench.

While the example embodiments of the disclosure have been described with reference to the accompanying drawings, it should be understood by those skilled in the art that various modifications may be made without departing from the scope of the disclosure and without changing essential features thereof. Therefore, the above-described example embodiments should be considered in a descriptive sense only and not for purposes of limitation.

What is claimed is:

1. A semiconductor package comprising:
a semiconductor chip;
a lower redistribution layer under the semiconductor chip, the lower redistribution layer comprising a lower insulating layer and a trench, the lower insulating layer at a central region of the semiconductor package and at a portion of an edge region of the semiconductor package, the trench at a remaining portion of the edge region;
a plurality of outer connecting terminals under the lower redistribution layer;
a molding layer comprising a first molding section and a second molding section, the first molding section being on the lower redistribution layer and surrounding a side surface of the semiconductor chip and the second molding section being in the trench and contacting a side surface of the lower insulating layer; and
an upper redistribution layer on the molding layer,
wherein an outer side surface of the lower insulating layer and a side surface of the second molding section are coplanar with each other.

2. The semiconductor package according to claim 1, wherein:
the lower insulating layer comprises,
a body at the central region, and
a plurality of protrusions at the edge region and contacting corners of the body, respectively, and
the trench is defined by the body and the plurality of protrusions.

3. The semiconductor package according to claim 2, wherein each of the plurality of protrusions has an L shape when viewed in a plan view.

4. The semiconductor package according to claim 1, wherein:
the lower insulating layer comprises,
a body at the central region, and
a plurality of protrusions at the edge region and contacting an edge of the body; and
the trench is defined by the body and the plurality of protrusions, and has an L shape when viewed in a plan view.

5. The semiconductor package according to claim 1, wherein a width of the edge region is 200 to 400 µm.

6. The semiconductor package according to claim 1, wherein the molding layer further comprises:
a third molding section at the central region and covering at least a part of a bottom surface of the lower insulating layer.

7. The semiconductor package according to claim 6, wherein the third molding section has a cross shape when viewed in a plan view.

8. The semiconductor package according to claim 6, wherein:
the third molding section includes a groove defined therein; and
the groove has a greater width at an upper portion thereof than at a lower portion thereof.

9. The semiconductor package according to claim 6, wherein a height of the third molding section is smaller than a height of the outer connecting terminals.

10. The semiconductor package according to claim 9, wherein the height of the third molding section is 40 to 60 µm.

11. The semiconductor package according to claim 1, wherein a side surface of the molding layer is aligned with a side surface of the upper redistribution layer.

12. The semiconductor package according to claim 1, further comprising:
a connecting via on the lower redistribution layer, the connecting via interconnecting the lower redistribution layer and the upper redistribution layer.

13. A semiconductor package comprising:
a semiconductor chip;
a lower redistribution layer under the semiconductor chip;
an upper redistribution layer on the semiconductor chip, the upper redistribution layer comprising an upper insulating layer and a trench, the upper insulating layer at a central region and at a portion of an edge region, the trench at a remaining portion of the edge region; and
a molding layer comprising a first molding section and a second molding section, the first molding section being on the lower redistribution layer and surrounding a side surface of the semiconductor chip and the second molding section being in the first trench and contacting a side surface of the upper insulating layer,
wherein an outer side surface of the upper insulating layer and a side surface of the second molding section are coplanar with each other,
wherein a height of the second molding section is equal to a height of the upper redistribution layer.

14. The semiconductor package according to claim 13, wherein the upper redistribution layer comprises:
upper redistribution patterns at the upper insulating layer; and
upper conductive vias interconnecting the lower redistribution layer and the upper redistribution patterns.

15. The semiconductor package according to claim 13, wherein a side surface of the lower redistribution layer is aligned with a side surface of the molding layer.

16. The semiconductor package according to claim 13, wherein the molding layer further comprises:
a third molding section on the second molding section and the upper redistribution layer and surrounding at least a portion of a top surface of the upper insulating layer at the central region.

17. The semiconductor package according to claim 16, wherein a height of the third molding section is 40 to 60 µm.

18. The semiconductor package according to claim 16, wherein:
the lower redistribution layer comprises a lower insulating layer at the central region and at a portion of the edge region, and a second trench at a remaining portion of the edge region; and
the molding layer further comprises a fourth molding section in the second trench and surrounding at least a portion of a bottom surface of the lower insulating layer.

19. A semiconductor package comprising:
a semiconductor chip;
a lower redistribution layer under the semiconductor chip, the lower redistribution layer comprising a lower insulating layer and a trench, the lower insulating layer at a central region and at a portion of an edge region, the trench at a remaining portion of the edge region, lower redistribution patterns in the lower insulating layer, an under bump metallization (UBM) pad at a lower portion of the lower insulating layer, and a lower conductive via interconnecting the lower redistribution patterns and interconnecting the lower redistribution patterns and the UBM pad;
an underfill between the semiconductor chip and the lower redistribution layer;
an outer connecting terminal under the lower redistribution layer and connected to the UBM pad;
a molding layer comprising a first molding section and a second molding section, the first molding section being on the lower redistribution layer and surrounding a side surface of the semiconductor chip and the second molding section being in the trench and contacting a side surface of the lower insulating layer;
an upper redistribution layer on the molding layer, the upper redistribution layer comprising an upper insulating layer, upper redistribution patterns at the upper insulating layer, and an upper conductive via interconnecting the upper redistribution patterns; and
a connecting via on the lower redistribution layer and interconnecting the lower redistribution patterns and the upper conductive via,
wherein an outer side surface of the lower insulating layer and a side surface of the second molding section, are coplanar with each other, and
wherein the portion of the edge region is a corner portion of the edge region or a central portion of the edge region.

20. The semiconductor package according to claim 19, wherein:
the molding layer further comprises a third molding section at the central region and covering at least a part of a bottom surface of the lower insulating layer; and
a height of the third molding section is 40 to 60 µm.

* * * * *